(12) United States Patent
Ito et al.

(10) Patent No.: US 8,705,909 B2
(45) Date of Patent: Apr. 22, 2014

(54) OPTICAL INTERCONNECT

(75) Inventors: Masataka Ito, Torrance, CA (US);
Dongdong Wang, Torrance, CA (US);
Christopher Lee Keller, Torrance, CA (US); Yoshitsugu Wakazono, Torrance, CA (US)

(73) Assignee: Ibiden Co., Ltd., Ogaki-shi (JP)

( * ) Notice: Subject to any disclaimer, the term of this patent is extended or adjusted under 35 U.S.C. 154(b) by 236 days.

(21) Appl. No.: 13/183,633

(22) Filed: Jul. 15, 2011

(65) Prior Publication Data

US 2012/0020612 A1    Jan. 26, 2012

Related U.S. Application Data

(60) Provisional application No. 61/365,069, filed on Jul. 16, 2010.

(51) Int. Cl.
*G02B 6/12* (2006.01)
*G02B 6/43* (2006.01)

(52) U.S. Cl.
CPC ........................................ *G02B 6/43* (2013.01)
USPC ............................................................ 385/14

(58) Field of Classification Search
None
See application file for complete search history.

(56) References Cited

U.S. PATENT DOCUMENTS

| | | | |
|---|---|---|---|
| 7,130,511 B2 | 10/2006 | Riester et al. | |
| 7,672,641 B2 * | 3/2010 | Yu et al. | 455/41.2 |
| 8,275,223 B2 * | 9/2012 | Wang et al. | 385/14 |
| 2008/0075405 A1 | 3/2008 | Wang et al. | |
| 2010/0195967 A1 * | 8/2010 | Wang et al. | 385/129 |
| 2011/0206316 A1 | 8/2011 | Wang et al. | |
| 2011/0236030 A1 | 9/2011 | Shao et al. | |
| 2012/0082413 A1 * | 4/2012 | Alameh et al. | 385/24 |

* cited by examiner

*Primary Examiner* — Sung Pak
(74) *Attorney, Agent, or Firm* — Oblon, Spivak, McClelland, Maier & Neustadt, L.L.P.

(57) ABSTRACT

An optical interconnect device including a first printed wiring board, a second printed wiring board facing the first printed wiring board, a light-emitting device positioned on the first printed wiring board and electrically connected to the first printed wiring board, a light-receiving device positioned on the second printed wiring board and electrically connected to the second printed wiring board such that the light-receiving device faces the light-emitting device and receives an optical signal transmitted in a direct line from the light-emitting device, and an electrical-connection device mounted on the first printed wiring board and the second printed wiring board such that the first printed wiring board is electrically connected to the second printed wiring board.

20 Claims, 13 Drawing Sheets

FIG. 5
(a)
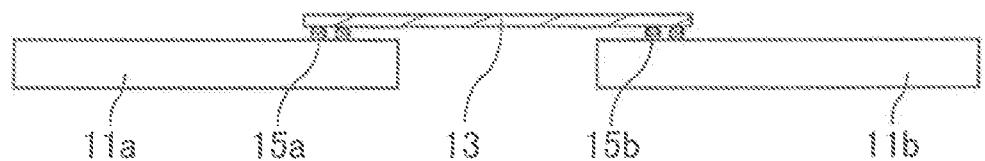
(b)
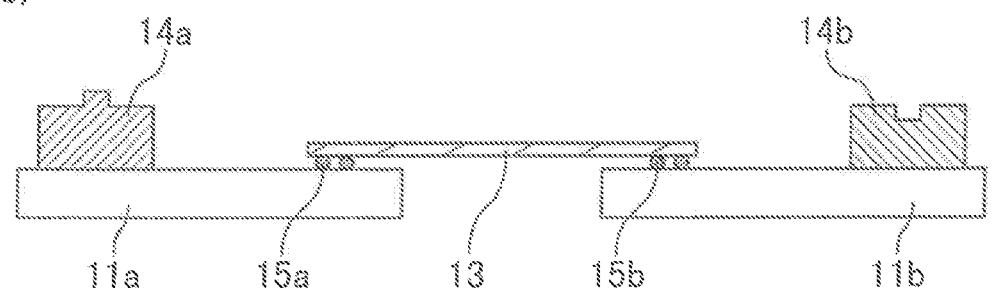
(c)
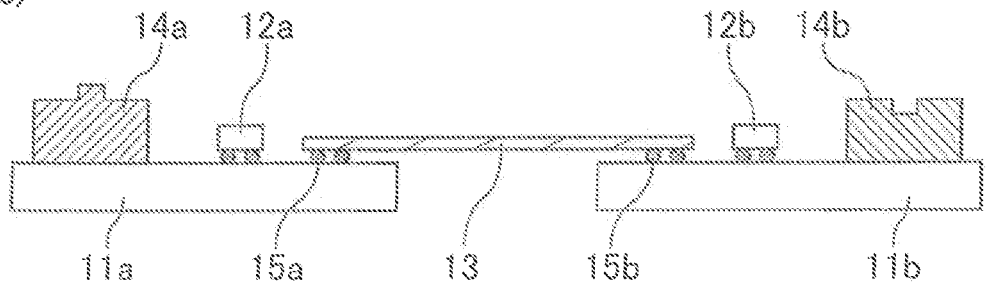
(d)
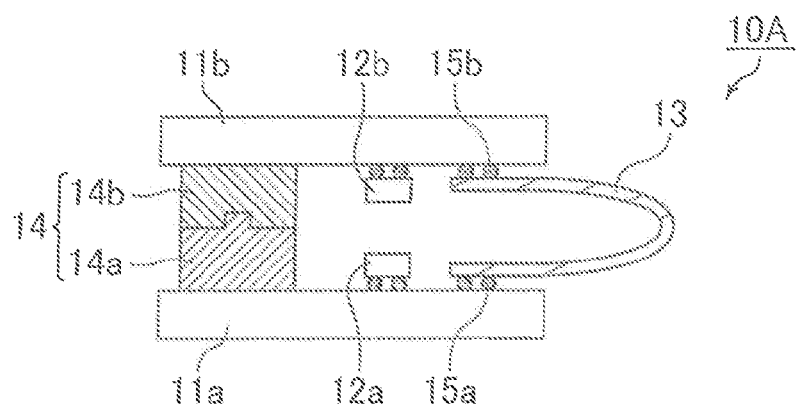

FIG. 11
(a)
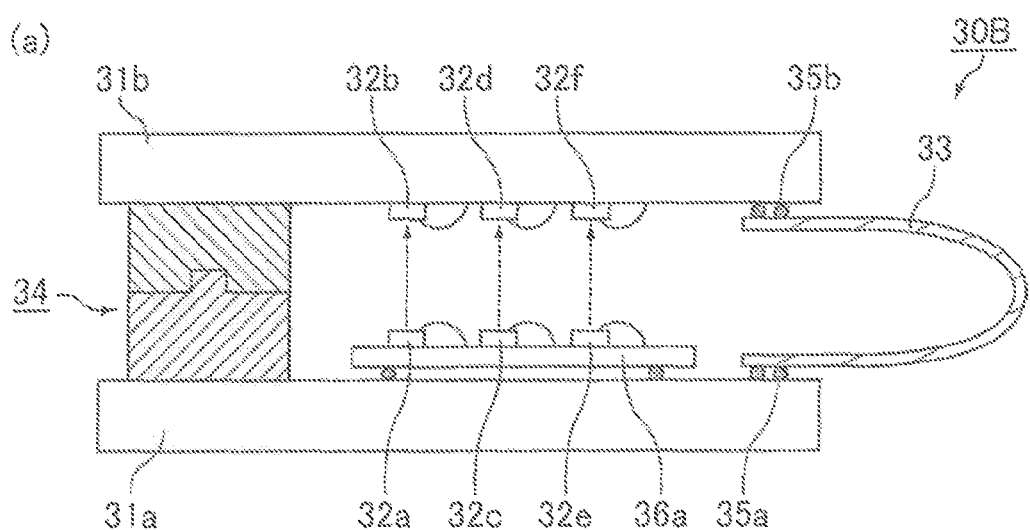
(b)
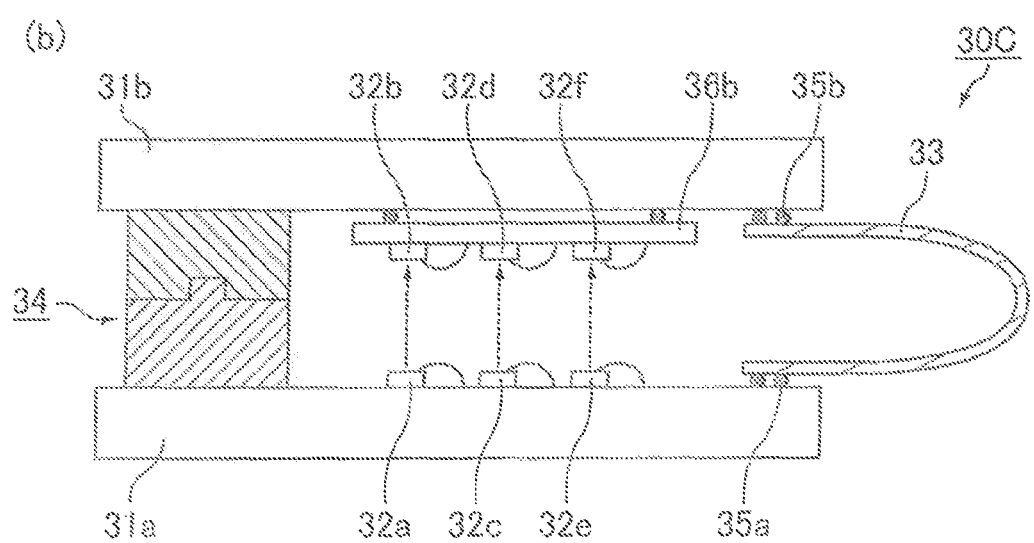

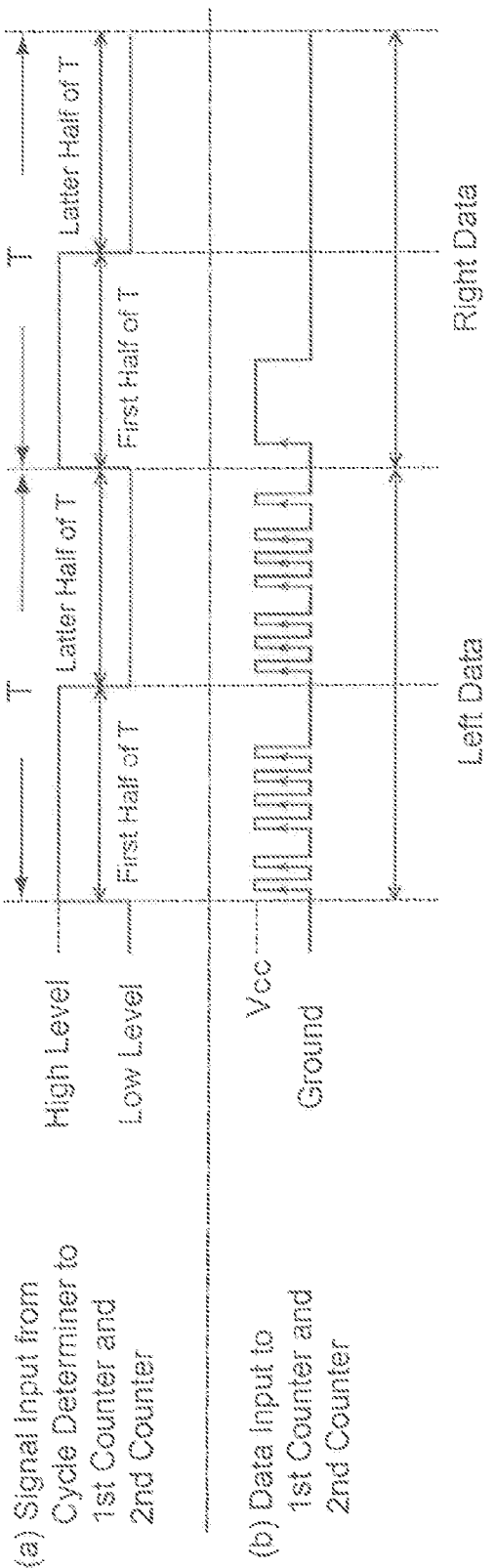

OPTICAL INTERCONNECT

CROSS-REFERENCE TO RELATED APPLICATIONS

The present application claims the benefits of priority to U.S. Application No. 61/365,069, filed Jul. 16, 2010. The contents of that application are incorporated herein by reference in their entirety.

BACKGROUND OF THE INVENTION

1. Field of the Invention

The present invention relates to an optical interconnect.

2. Discussion of the Background

In portable devices such as a cell phone, data transmission is often carried out among multiple printed wiring boards (PWBs) each having a different function. For example, image data or the like are transmitted from a main printed wiring board to a printed wiring board which is arranged for image display.

In U.S. Pat. No. 7,130,511, a flexible signal cable is described for optically transmitting data between printed wiring boards. The flexible signal cable described in U.S. Pat. No. 7,130,511 is formed with a flexible wiring board, a light-emitting element and a light-receiving element electrically connected to the flexible wiring board, and an optical waveguide formed on the flexible wiring board to optically connect the light-emitting element and light-receiving element.

The flexible signal cable described in U.S. Pat. No. 7,130,511 is structured as an optical interconnect by connecting both ends to their respective printed wiring boards. In an optical interconnect using a flexible signal cable, data to be transmitted from a printed wiring board on the data-transmitter side are transmitted to a light-emitting element as an electrical signal. The light-emitting element converts the electrical signal to an optical signal. The optical signal converted by the light-emitting element is transmitted from the light-emitting element to a light-receiving element, passing through an optical waveguide formed on the flexible signal cable. The light-receiving element receives the optical signal transmitted to the light-receiving element and converts the optical signal to an electrical signal. Then, the electrical signal converted by the light-receiving element is transmitted to a printed wiring board on the data-receiver side.

As so described, in an optical interconnect using a flexible signal cable, data are transmitted as optical signals between two printed wiring boards through a light-emitting element, an optical waveguide and a light-receiving element.

FIG. 1 is a cross-sectional view schematically showing an example of a conventional optical interconnect in which printed wiring boards for data transmission face each other. As optical interconnect 110 in FIG. 1 shows, even if printed wiring board (111*a*) and printed wiring board (111*b*) face each other, data are transmitted as an optical signal through light-emitting element (112*a*), optical waveguide 115 and light-receiving element (112*b*). The arrow with a broken line in FIG. 1 schematically shows the direction in which the optical signal is transmitted. The optical signal passes through the optical waveguide.

When printed wiring board (111*a*) and printed wiring board (111*b*) face each other, flexible wiring board 113 always stays in a bent condition. Thus, optical waveguide 115 formed on flexible wiring board 113 is required to be flexible so that it curves, and does not bend, when it is folded. In addition, optical waveguide 115 is required to have features such as lowered optical signal loss even when it is curved. As a result, there is a concern that the material and the method for manufacturing an optical waveguide of an optical interconnect are limited.

The contents of U.S. Pat. No. 7,130,511 are incorporated herein by reference in their entirety in this application.

SUMMARY OF THE INVENTION

According to one aspect of the present invention, an optical interconnect device includes a first printed wiring board, a second printed wiring board facing the first printed wiring board, a light-emitting device positioned on the first printed wiring board and electrically connected to the first printed wiring board, a light-receiving device positioned on the second printed wiring board and electrically connected to the second printed wiring board such that the light-receiving device faces the light-emitting device and receives an optical signal transmitted in a direct line from the light-emitting device, and an electrical-connection device mounted on the first printed wiring board and the second printed wiring board such that the first printed wiring board is electrically connected to the second printed wiring board.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5(*a*)~FIG. 5(*d*) are cross-sectional views schematically showing an example of the method for manufacturing an optical interconnect according to the first embodiment of the present invention;

FIG. 11(*a*) and FIG. 11(*b*) are cross-sectional views schematically showing other examples of the optical interconnect according to the third embodiment of the present invention;

FIG. 19(a) and FIG. 19(b) are diagrams to illustrate information on two cycles of a data signal to be counted after being input to a control circuit having a switching function.

DETAILED DESCRIPTION OF THE EMBODIMENTS

Figure 1:
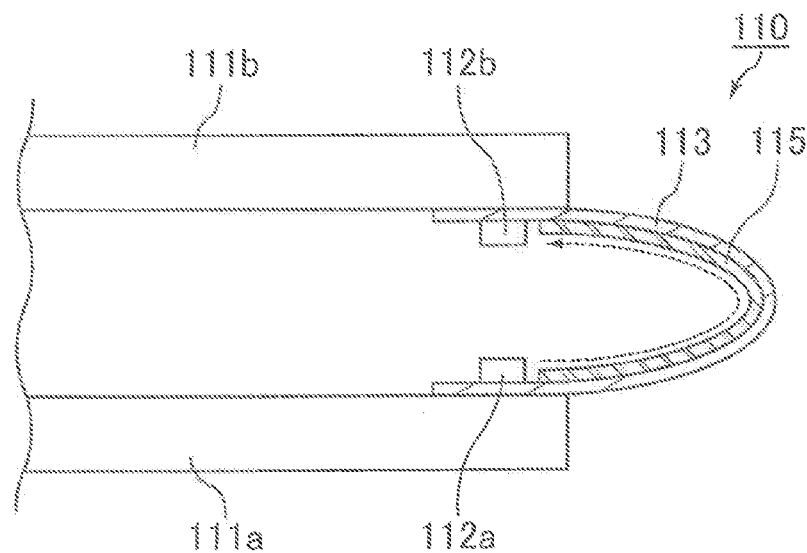
FIG. 1 is a cross-sectional view schematically showing an example of a conventional optical interconnect in which printed wiring boards for data transmission face each other.

The embodiments will now be described with reference to the accompanying drawings, wherein like reference numerals designate corresponding or identical elements throughout the various drawings.

In the present application, "bent" means a situation in which a straight line is bent linearly, and "curved" means a situation in which a line is bent to make a curve (namely, like a bow).

First Embodiment

In an optical interconnect according to the first embodiment of the present invention, a light-emitting element is positioned on a first printed wiring board and a light-receiving element is positioned on a second printed wiring board.

In the following description, a light-emitting element and a light-receiving element are also referred to as optical elements. Also, when it is not required to distinguish a first printed wiring board and a second printed wiring board, they may also be referred to simply as printed wiring boards.

Figure 2:
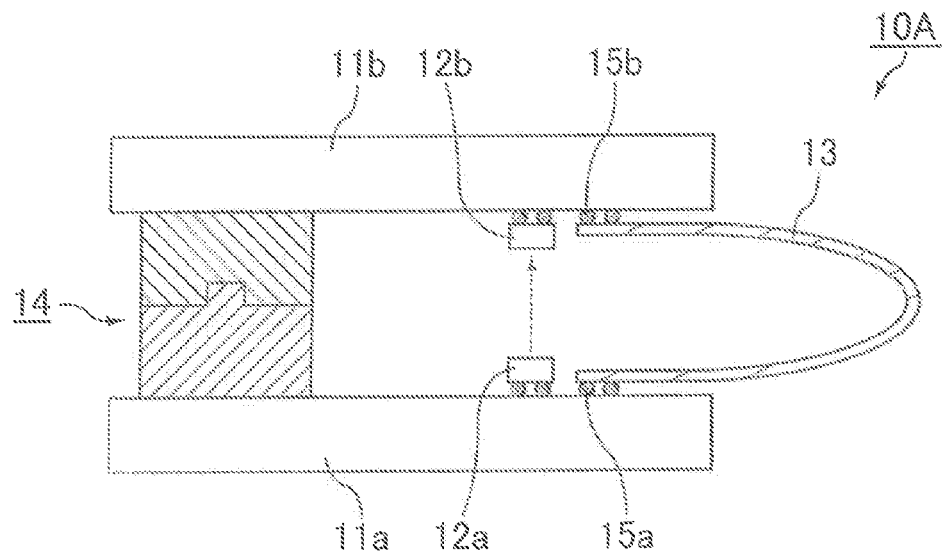
FIG. 2 is a cross-sectional view schematically showing an example of the optical interconnect according to the first embodiment of the present invention.

FIG. 2 is a cross-sectional view schematically showing an example of the optical interconnect according to the first embodiment of the present invention. Optical interconnect (10A) shown in FIG. 2 has first printed wiring board (11a), second printed wiring board (11b), light-emitting element (12a), light-receiving element (12b), flexible wiring board 13 and connector 14.

In optical interconnect (10A), second printed wiring board (11b) faces first printed wiring board (11a). Then, light-receiving element (12b) is positioned to face light-emitting element (12a).

First printed wiring board (11a) is a rigid wiring board. Light-emitting element (12a) is mounted on first printed wiring board (11a). Thus, light-emitting element (12a) is electrically connected to first printed wiring board (11a). Second printed wiring board (11b) is a rigid wiring board. Light-receiving element (12b) is mounted on second printed wiring board (11b). Thus, light-receiving element (12b) is electrically connected to second printed wiring board (11b).

First printed wiring board (11a) and second printed wiring board (11b) are connected to mounting substrates such as a line card through an electrical interface (not shown in the drawing) made of a BGA (ball grid array) each formed on their bottom surfaces. As for the electrical interface, instead of a BGA, detachable electrical connector terminals may also be used.

In an optical interconnect of the present embodiment, the first printed wiring board and the second printed wiring board may be made of a rigid wiring board of the same type or rigid wiring boards of different types. As for a rigid wiring board, for example, a multilayer printed wiring board, such as that formed by laminating conductive circuits and interlayer resin insulation layers on both surfaces of a substrate and forming solder-resist layers on the outermost layers, is listed. In addition, as for the substrate for forming a rigid wiring board, for example, various rigid substrates such as follows are listed: Bakelite substrate, glass-composite substrate, glass-epoxy substrate, Teflon substrate, alumina substrate, composite substrate and halogen-free substrate.

In an optical interconnect of the present embodiment, the first printed wiring board and the second printed wiring board are connected electrically and optically. First, the optical connection is described. In an optical interconnect of the present embodiment, the first printed wiring board and the second printed wiring board are optically connected through a light-emitting element and a light-receiving element. In optical interconnect (10A) shown in FIG. 2, data transmitted from first printed wiring board (11a) on the data-transmitter side is transmitted to light-emitting element (12a) as an electrical signal. The electrical signal is converted to an optical signal at light-emitting element (12a). The optical signal converted by light-emitting element (12a) is transmitted from light-emitting element (12a) directly to light-receiving element (12b). The optical signal transmitted to light-receiving element (12b) is received by light-receiving element (12b), and the optical signal is converted to an electrical signal by light-receiving element (12b). Then, the electrical signal converted by light-receiving element (12b) is transmitted to second printed wiring board (11b) on the data-receiver side. As described above, light-receiving element (12b) is structured so as to be capable of directly receiving the optical signal transmitted from light-emitting element (12a). In FIG. 2, the arrow with a broken line schematically shows the optical signal route.

As for a light-emitting element in an optical interconnect of the present embodiment, for example, a laser diode (LD, semiconductor laser), a DFB-LD (distributed-feedback semiconductor laser), an LED (light-emitting diode), an infrared or oxide-confined VCSEL (surface-emitting semiconductor laser) and the like are listed. As for a laser diode, for example, an edge-emitting laser diode, a surface-emitting laser diode and the like are listed. Among those light-emitting elements, a surface-emitting VCSEL is preferred, because it makes direct optical connection with a light-receiving element easier.

As for the material for a light-emitting element in an optical interconnect of the present invention, a gallium arsenide phosphide compound (GaAsP), a gallium aluminum arsenide compound (GaAlAs), a gallium arsenide compound (GaAs), an indium gallium arsenide compound (InGaAs), an indium gallium arsenide phosphide compound (InGaAsP) and the like are listed. They are selected according to the communication wavelength. For example, if a communication wavelength is in the 0.85 μm band, GaAlAs is used, and if a communication wavelength is in the 1.3 μm or 1.55 μm band, InGaAs or InGaAsP is used.

As for a light-receiving element in an optical interconnect of the present embodiment, for example, a photodiode (PD), an APD (avalanche photodiode) and the like are listed. As for a photodiode, for example, an edge-receiving photodiode, surface-receiving photodiode and the like are listed. Among the above light-receiving elements, a surface-receiving photodiode is preferred, because it makes direct optical connection with a light-emitting element easier.

As for the material for the light-receiving element in an optical interconnect of the present invention, silicon (Si), germanium (Ge), InGaAs and the like are listed. Among those, InGaAs is preferred because of its excellent light-receiving sensitivity.

In an optical interconnect of the present embodiment, the light-emitting element and the light-receiving element may each be a multichannel array element.

In FIG. 2, optical interconnect (10A) shows an example in which light-emitting element (12a) and light-receiving element (12b) are each an optical element flip-chip bonded to a printed wiring board through solder bumps or the like. However, in an optical interconnect of the present embodiment, the light-emitting element and the light-receiving element may each be a wire-bonding optical element as well.

In an optical interconnect of the present embodiment, the distance between the light-emitting element and the light-receiving element is preferred to be approximately 0.2 mm or greater. Also, the distance between the light-emitting element and the light-receiving element is preferred to be approximately 5 mm or less, more preferably approximately 2 mm or less. If the distance between the light-emitting element and the light-receiving element is in the above range, even if the alignment accuracy is low between the light-emitting element and the light-receiving element, optical signal loss is maintained approximately at the same level as the loss using a regular optical waveguide.

Next, the electrical-connection is described. In an optical interconnect of the present embodiment, a first printed wiring board and a second printed wiring board are electrically connected through an electrical-connection section arranged on the surface of each printed wiring board. In optical interconnect (10A) shown in FIG. 2, first printed wiring board (11a) and second printed wiring board (11b) are electrically connected by flexible wiring board 13. Specifically, flexible wiring board 13 is electrically connected to first printed wiring board (11a) and second printed wiring board (11b) through conductive materials (15a, 15b) formed respectively on the surfaces of first printed wiring board (11a) and second printed wiring board (11b).

In the present application, the section having the function of electrically connecting the first printed wiring board and the second printed wiring board is referred to as an "electrical-connection section." Namely, in optical interconnect (10A) shown in FIG. 2, conductive materials (15a, 15b) along with flexible wiring board 13 correspond to the electrical-connection section.

In an optical interconnect of the present embodiment, solder, conductive adhesive and the like, for example, are listed for the conductive material to form the electrical-connection section. As for solder, for example, well-known solders such as the following types of solders are used: lead (Pb), tin (Sn), lead-tin (Pb—Sn), indium (In), aluminum (Al), tin-copper (Sn—Cu), tin-silver (Sn—Ag), tin-bismuth (Sn—Bi) and tin-zinc (Sn—Zn).

As for conductive adhesives, for example, the following are used: thermosetting resins (such as epoxy resin, phenol resin, acrylic resin, urethane resin and silicone resin) containing conductive filler; or thermoplastic resins (such as polyamide, polyethylene, polystyrene, polyester, polyurethane, ethylene vinyl acetate copolymer and ethylene ethyl acrylate copolymer) containing conductive filler. As for conductive fillers, the following are listed: conductive metal powder such as silver, gold, copper, nickel, platinum or palladium; those using inorganic insulator such as alumina or glass, or organic polymer such as polyethylene, polystyrene or divinylbenzene as a core material and coating the core surfaces with conductive layers such as gold or nickel; carbon, graphite and so forth. Such conductive filler may be a flake type, spherical type, short fiber type or the like.

In an optical interconnect of the present embodiment, various flexible substrates made from, for example, polyimide, liquid crystal polymer and the like are used as a substrate to form the flexible wiring board.

In optical interconnect (10A) shown in FIG. 2, first printed wiring board (11a) and second printed wiring board (11b) are coupled with each other by connector 14. Connector 14 mechanically connects first printed wiring board (11a) and second printed wiring board (11b). Moreover, connector 14 has the function of setting the relative positions of light-emitting element (12a) and light-receiving element (12b).

In the present application, the section having the function of setting the relative positions of a light-emitting element and a light-receiving element is referred to as a "positioning section." Namely, connector 14 corresponds to the positioning section in optical interconnect (10A) shown in FIG. 2.

In an optical interconnect of the present embodiment, the connector structure is not limited specifically as long as it is structured to couple two printed wiring boards. FIG. 2 shows an example of a press-fit connector to make a vertical coupling. However, it may also be a press-fit connector to make a horizontal coupling. Alternatively, the connector may be formed with a pair of coupling members, such as a bolt and a nut. Yet alternatively, the connector may be structured to connect two printed wiring boards by forming a hole in one printed wiring board and a coupling rod in the other printed wiring board and then by inserting the coupling rod into the hole. In such a case, the combination of a hole and a coupling rod is also referred to as a connector.

In an optical interconnect of the present embodiment, the connector may be an electrical connector. In such a case, the electrical connector may also electrically connect the first printed wiring board and the second printed wiring board.

An optical interconnect of the present embodiment is not always required to be structured with a positioning section having the function of setting the relative positions of a light-emitting element and a light-receiving element. However, an optical interconnect is preferred to have a positioning section, because alignment accuracy increases between the light-emitting element and the light-receiving element if the optical interconnect is structured with a positioning section.

Figure 3:
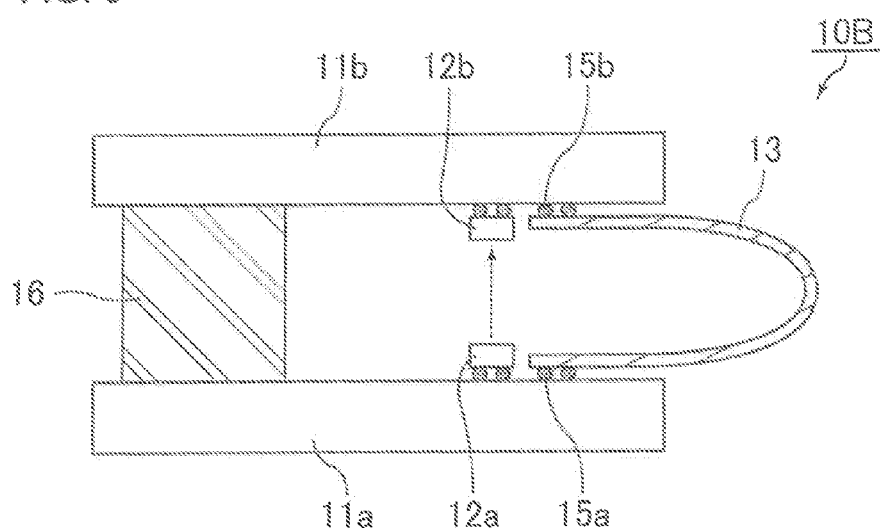
FIG. 3 is a cross-sectional view schematically showing another example of the optical interconnect according to the first embodiment of the present invention.

If an optical interconnect of the present embodiment is not structured with a positioning section, spacer 16 is preferred to be inserted between the first printed wiring board and the second printed wiring board as shown in optical interconnect (10B) in FIG. 3. In such a case, the structure or the material for the spacer is not limited specifically as long as the relative positions of the first printed wiring board and the second printed wiring board are set by the spacer.

Figure 4:
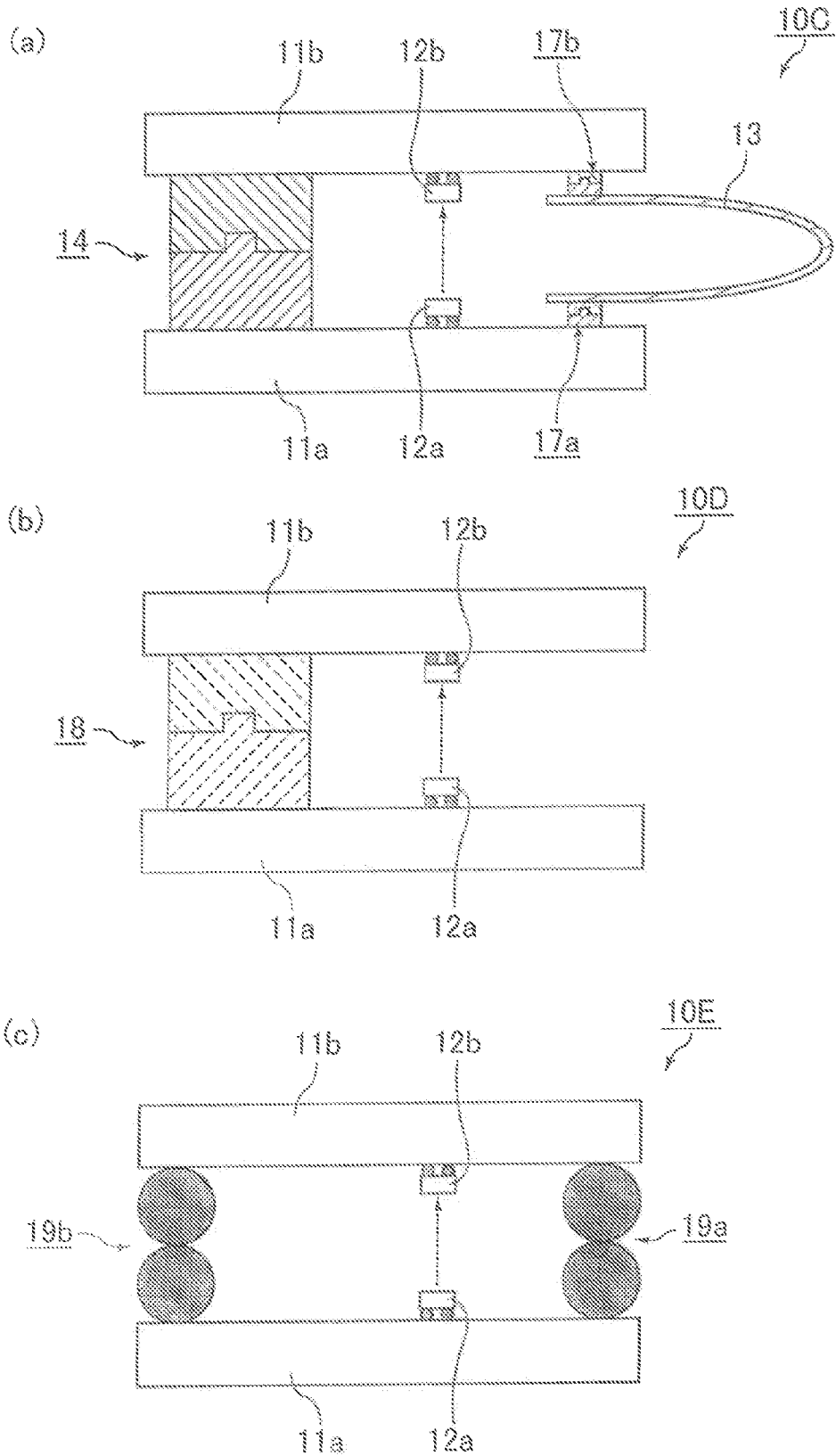
FIG. 4(*a*), FIG. 4(*b*) and FIG. 4(*c*) are cross-sectional views schematically showing other examples of the optical interconnect according to the first embodiment of the present invention.

In an optical interconnect of the present embodiment, the electrical-connection section is not limited to the above-described conductive material with a flexible wiring board. FIG. 4(a), FIG. 4(b) and FIG. 4(c) are cross-sectional views schematically showing other examples of the optical interconnect according to the first embodiment of the present invention.

In optical interconnect (10C) shown in FIG. 4(a), first printed wiring board (11a) and second printed wiring board (11b) are electrically connected by flexible wiring board 13 the same as in optical interconnect (10A) shown in FIG. 2. However, in optical interconnect (10C) in FIG. 4(a), flexible wiring board 13 electrically connects first printed wiring board (11a) and second printed wiring board (11b) through electrical connectors (17a, 17b) formed on their respective surfaces of first printed wiring board (11a) and second printed wiring board (11b). Namely, in optical interconnect (10C) shown in FIG. 4(a), electrical connectors (17a, 17b) along with flexible wiring board 13 correspond to the electrical-connection section which electrically connects first printed wiring board (11a) and second printed wiring board (11b).

In optical interconnect (10C) shown in FIG. 4(a), an example having connector 14 as a positioning section is shown. As for the connector, the above-described types are used. Also, in optical interconnect (10C) shown in FIG. 4(a), a spacer may be inserted instead of a positioning section such as a connector.

In optical interconnect (10D) shown in FIG. 4(b), first printed wiring board (11a) and second printed wiring board (11b) are electrically connected by electrical connector 18. Namely, in optical interconnect (10D) shown in FIG. 4(b), electrical connector 18 is the electrical-connection section for electrically connecting first printed wiring board (11a) and second printed wiring board (11b).

In optical interconnect (10D) shown in FIG. 4(b), electrical connector 18 may also have the function of setting the relative positions of light-emitting element (12a) and light-receiving element (12b), along with the function of electrically connecting first printed wiring board (11a) and second printed wiring board (11b).

In the present application, the section having the function of electrically connecting a first printed wiring board and a second printed wiring board as well as the function of setting the relative positions of a light-emitting element and a light-receiving element is also referred to as an "electrical-connection and positioning section." Namely, in optical interconnect (10D) shown in FIG. 4(b), electrical connector 18 may be simply the electrical-connection section, or the electrical-connection and positioning section.

An electrical connector may be structured the same as a press-fit connector, but the structure is not limited to a specific type.

In optical interconnect (10E) shown in FIG. 4(c), first printed wiring board (11a) and second printed wiring board (11b) are electrically connected by bump-shaped conductive material (19a) or (19b). Namely, in optical interconnect (10E) shown in FIG. 4(c), conductive material (19a) or (19b) is the electrical-connection section to electrically connect first printed wiring board (11a) and second printed wiring board (11b).

As the conductive material in optical interconnect (10E) shown in FIG. 4(c), for example, solder, conductive adhesive and the like are listed. As for solder or conductive adhesive, those mentioned above are used. Moreover, the conductive material is not limited to being bump-shaped, and any other type such as a sheet may also be used.

Next, the method for manufacturing an optical interconnect of the present embodiment is described with reference to the drawings. Here, an example of the method is described for manufacturing optical interconnect (10A) shown in FIG. 2. FIG. 5(a)~FIG. 5(d) are cross-sectional views schematically showing an example of the method for manufacturing an optical interconnect according to the first embodiment of the present invention.

First, as shown in FIG. 5(a), using conductive materials (15a, 15b), flexible wiring board 13 is fixed onto first printed wiring board (11a) and second printed wiring board (11b). Next, as shown in FIG. 5(b), connector members (14a, 14b) forming connector 14 are mounted at predetermined positions on first printed wiring board (11a) and second printed wiring board (11b). In FIG. 5(b), connector member (14a) is set as the male and connector member (14b) is set as the female, but connector members may be mounted by inverting the male and female. Next, as shown in FIG. 5(c), light-emitting element (12a) is mounted on first printed wiring board (11a), and light-receiving element (12b) is mounted on second printed wiring board (11b). During that time, light-emitting element (12a) and light-receiving element (12b) are mounted at predetermined positions relative to connector members (14a, 14b).

Lastly, as shown in FIG. 5(d), connector 14 is formed by fitting connector members (14a, 14b) so that first printed wiring board (11a) faces second printed wiring board (11b). Since light-emitting element (12a) and light-receiving element (12b) are positioned at predetermined spots relative to connector members (14a, 14b), light-emitting element (12a) and light-receiving element (12b) face each other accurately. Through the above procedure, optical interconnect (10A) shown in FIG. 2 is manufactured.

When manufacturing an optical interconnect of the present embodiment, an optical element (light-emitting element or light-receiving element) is required to be positioned at a predetermined spot relative to the connector, but the order of the manufacturing process is not limited specifically. For example, the method may be in the order of mounting an optical element on a printed wiring board, and then positioning a connector at a predetermined spot relative to the optical element.

In the following, effects of an optical interconnect of the present embodiment are listed.

(1) In an optical interconnect of the present embodiment, the light-receiving element directly receives an optical signal transmitted from the light-emitting element between printed wiring boards facing each other. Unlike a conventional optical interconnect using a flexible signal cable, an optical waveguide is not required in an optical interconnect of the present embodiment. As a result, optical signal loss, which would occur when an optical signal is transmitted from a light-emitting element to an optical waveguide and when the optical signal is transmitted from the optical waveguide to a light-receiving element, does not occur. Therefore, in an optical interconnect of the present embodiment, optical signal loss is less than in a conventional optical interconnect.

As described above, in an optical interconnect of the present embodiment, even if the output power of an optical signal emitted from the light-emitting element is reduced, the optical signal is sufficiently received by the light-receiving element. As a result, drive current is reduced for the side of the light-emitting element from which optical signals are emitted, and thus power consumption decreases.

(2) As described above, in an optical interconnect of the present embodiment, it is not necessary to consider optical signal loss when an optical signal is transmitted from a light-emitting element to an optical waveguide, and when the optical signal is transmitted from the optical waveguide to a light-receiving element. Therefore, alignment accuracy of the relative positions is not required between the light-emitting element and the optical waveguide, nor between the optical waveguide and the light-receiving element. Accordingly, costs are reduced for mounting an optical waveguide, light-emitting element and light-receiving element on a flexible wiring board. Also, the optical coupling in an optical interconnect of the present embodiment is carried out through a direct coupling between the light-emitting element and the light-receiving element, namely, an optical signal is directly transmitted from the light-emitting element to the light-receiving element. Thus, even if the alignment accuracy is low between the light-emitting element and the light-receiving element, optical signal loss is reduced.

(3) In addition, since an optical waveguide is not required in an optical interconnect of the present embodiment, costs for manufacturing and processing an optical waveguide along with costs for mounting the optical waveguide on a flexible wiring board are eliminated when manufacturing an optical interconnect.

In the following, effects of an optical interconnect of the present embodiment are described more specifically.

Figure 6:
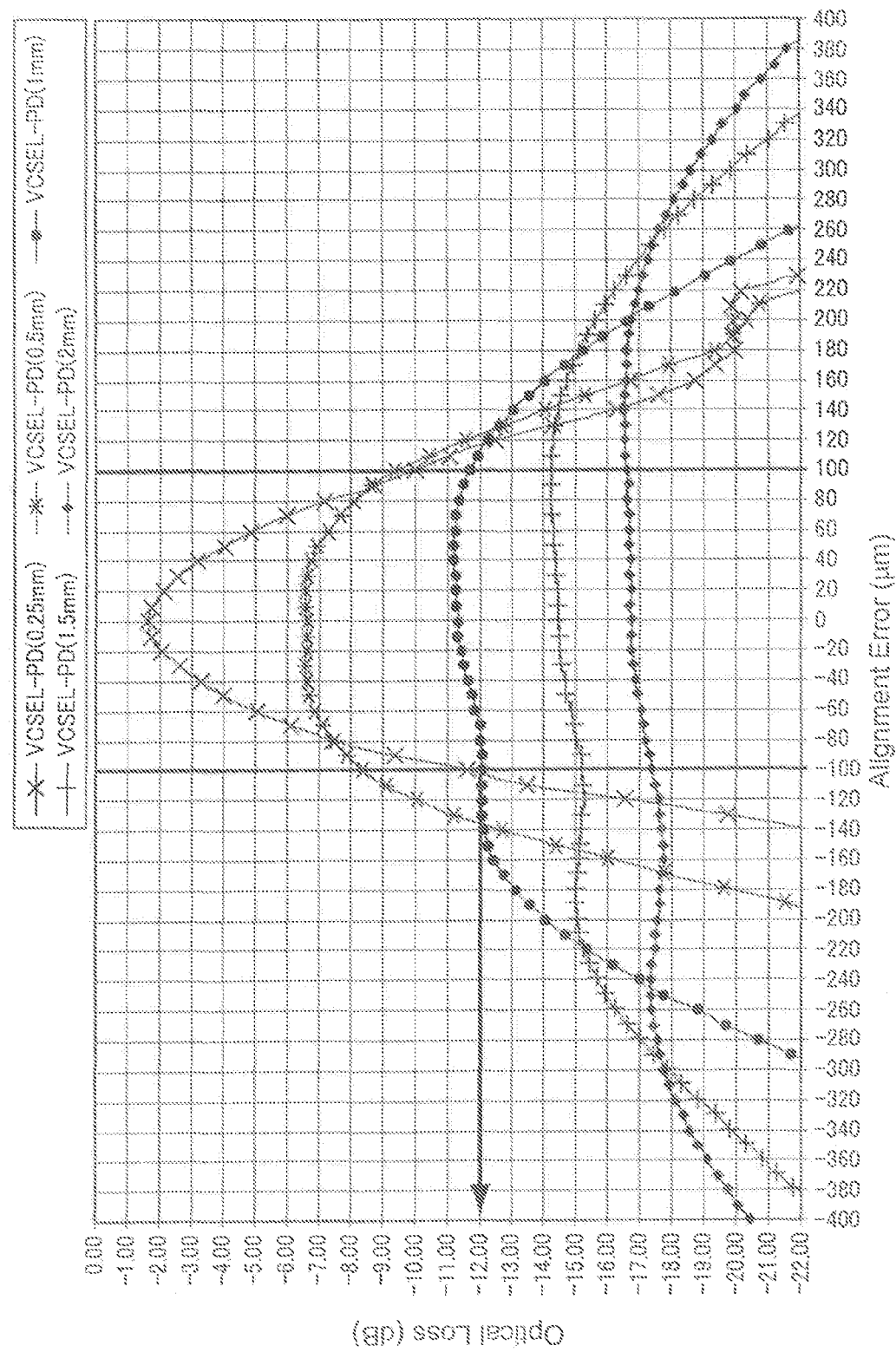
FIG. 6 is a graph showing the relationships of alignment error and optical loss between a light-emitting element and a light-receiving element.

FIG. 6 is a graph showing the relationships of alignment error and optical loss between a light-emitting element and a light-receiving element. FIG. 6 shows the results using an optical interconnect according to the first embodiment of the present invention. In particular, using a VCSEL, a surface emitting element, as a light-emitting element and a surface-receiving photodiode as a light-receiving element, the relationships of alignment error (tolerance) and optical loss are shown when the distance (VCSEL-PD) is changed between the light-emitting element and the light-receiving element.

Figure 7:
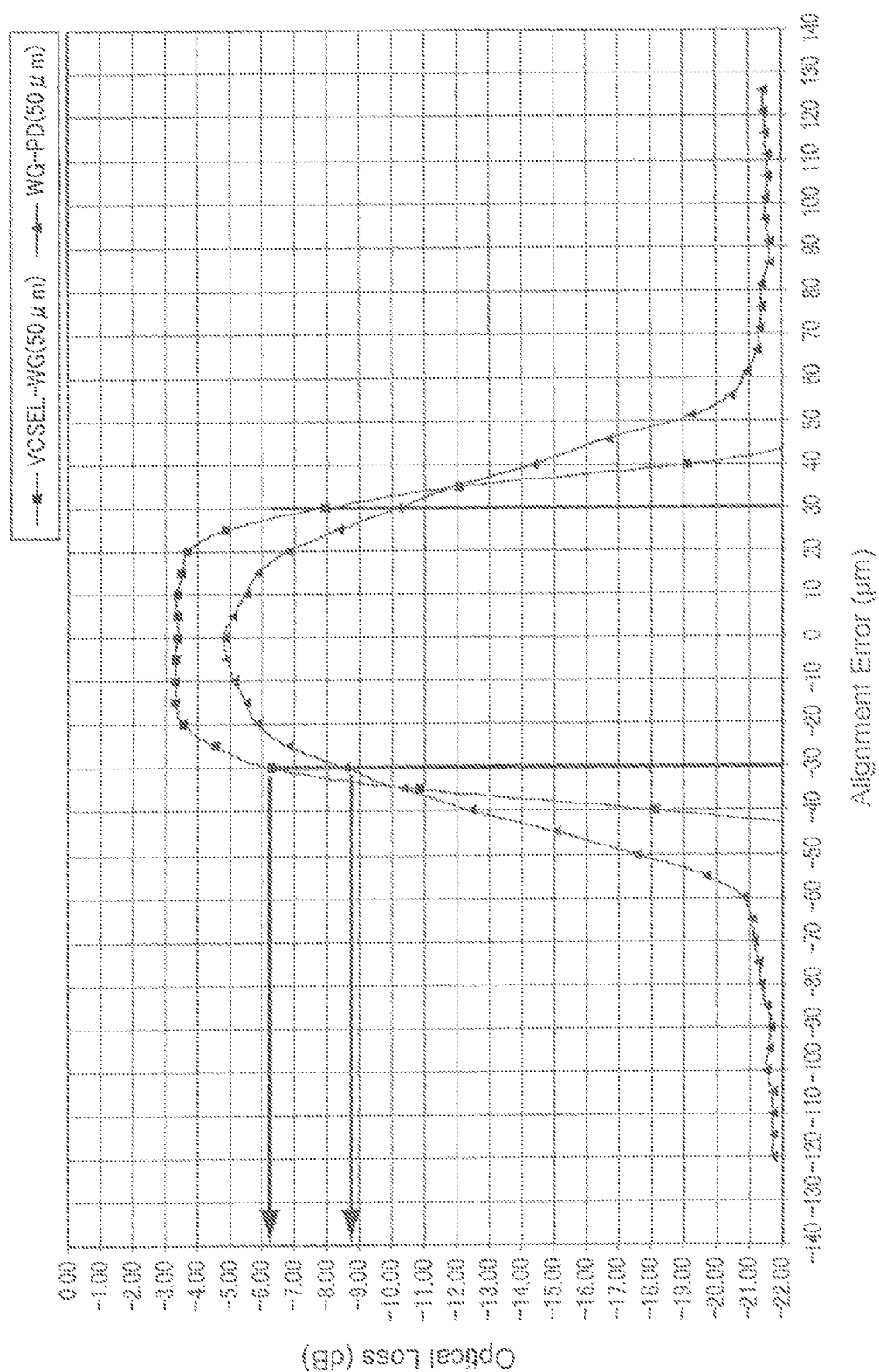
FIG. 7 is a graph showing the relationships of alignment error and optical loss between a light-emitting element and an optical waveguide or between the optical waveguide and a light-receiving element.

FIG. 7 is a graph showing the relationships of alignment error and optical loss between a light-emitting element and an optical waveguide, or between the optical waveguide and a light-receiving element. FIG. 7 shows the results using a conventional optical interconnect having an optical waveguide. In particular, using a VCSEL as a light-emitting element and a photodiode as a light-receiving element, and setting the distance between the light-emitting element and the optical waveguide (VCSEL-WG) and the distance between the optical waveguide and the light-receiving element (WG-PD) at 50 μm respectively, the relationships of alignment error and optical loss are shown.

The unit for optical loss, dB (decibel), is the unit for showing the relative differences in signal powers. As shown in the formula "dB=10×$Log_{10}$ ($P_1/P_2$)," dB is expressed by using a logarithm of the ratio of two signal powers. In the formula, "$Log_{10}$" is the base-10 logarithm. In addition, "$P_1$" and "$P_2$" are signal powers to be compared. For example, an optical interconnect of the present embodiment is considered where the distance is set at 1 mm between the light-emitting element and the light-receiving element. When the alignment error (mounting accuracy) between the light-emitting element and the light-receiving element is approximately ±100 μm, approximately the same mounting accuracy in electronic components, FIG. 6 shows that the optical loss is approximately 12 dB in a transmission from the light-emitting element to the light-receiving element.

Next, a conventional optical interconnect having an optical waveguide is considered. In the conventional optical interconnect, the alignment error (mounting accuracy) between the light-emitting element and the optical waveguide and the alignment error (mounting accuracy) between the optical waveguide and the light-receiving element are usually ±30 μm. In such a case, FIG. 7 shows that the optical loss in a transmission from the light-emitting element to the optical waveguide is approximately 6 dB, and the optical loss when the optical signal is transmitted from the optical waveguide to the light-receiving element is approximately 9 dB. Therefore, the total optical loss is approximately 15 dB in a transmission from the light-emitting element to the light-receiving element.

If an optical interconnect of the present embodiment is compared with a conventional optical interconnect, the difference in optical loss is 3 dB. In this case, the power ratio is 2 because "3 dB=10×$Log_{10}$ (2)." Namely, when an optical interconnect of the present embodiment is used, even if the optical power on the transmitter side is set at half of that using a conventional optical interconnect, the optical power on the receiver side is the same.

Figure 8:
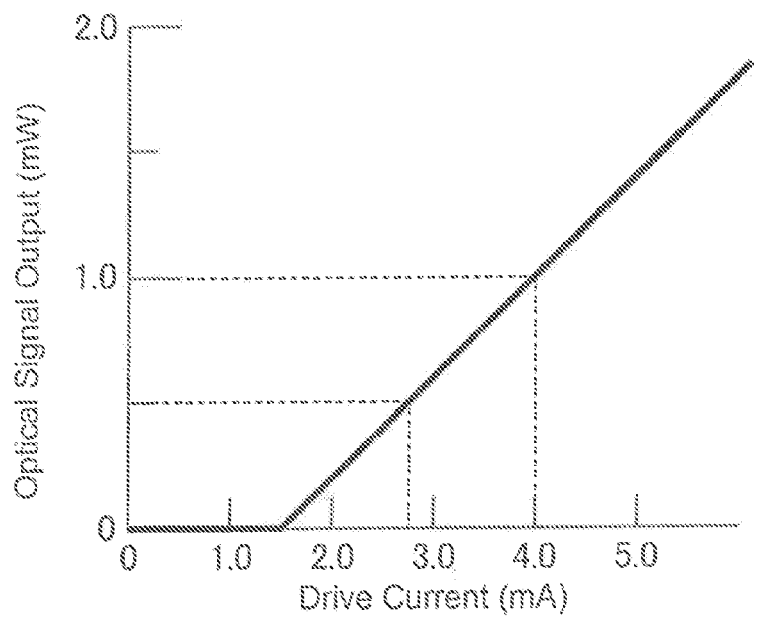
FIG. 8 is a graph showing the relationship of drive current and optical signal output power when the light-emitting element is a VCSEL.

FIG. 8 is a graph showing the relationship of drive current and optical signal output power when the light-emitting element is a VCSEL. As shown in FIG. 8, the threshold current is 1.5 mA and the slope efficiency is 0.4 W/A in a typical VCSEL. For example, when the optical power on the receiver side is 15 dBm, the drive current in the VCSEL on the transmitter side is 2.75 mA (=1.5 [mA]+0.5 [mW]/0.4 [W/A]) in an optical interconnect of the present embodiment. By contrast, in a conventional optical interconnect, the drive current in a VCSEL on the transmitter side is 4.0 mA (=1.5 [mA]+1.0 [mW]/0.4 [W/A]). Since applied voltage is usually 2.5V, power consumption is 6.9 mW in an optical interconnect of the present embodiment, and 10 mW in a conventional optical interconnect. Accordingly, when an optical interconnect of the present embodiment is used, power consumption is reduced by approximately 30% compared with a case when a conventional optical interconnect is used. Besides, if a conventional optical interconnect is used, optical loss also occurs when an optical signal goes through the optical waveguide. Thus, when an optical interconnect of the present embodiment is used, power consumption is further reduced.

The unit for optical power, dBm, is a unit for optical signal output power based on 1 mW. Unit dBm is expressed by a formula "dBm=dBmW=10×$Log_{10}$ (signal power [mW]/1 [mW]).

Second Embodiment

An optical interconnect according to the second embodiment of the present invention further contains an interposer positioned between a first printed wiring board and a second printed wiring board. An optical path is formed in the interposer to guide an optical signal transmitted from a light-emitting element to a light-receiving element, and a penetrating hole is formed in the optical path. The rest is the same as the structure of an optical interconnect according to the first embodiment of the present invention. Therefore, descriptions redundant with those in an optical interconnect according to the first embodiment of the present invention are omitted here.

Figure 9:
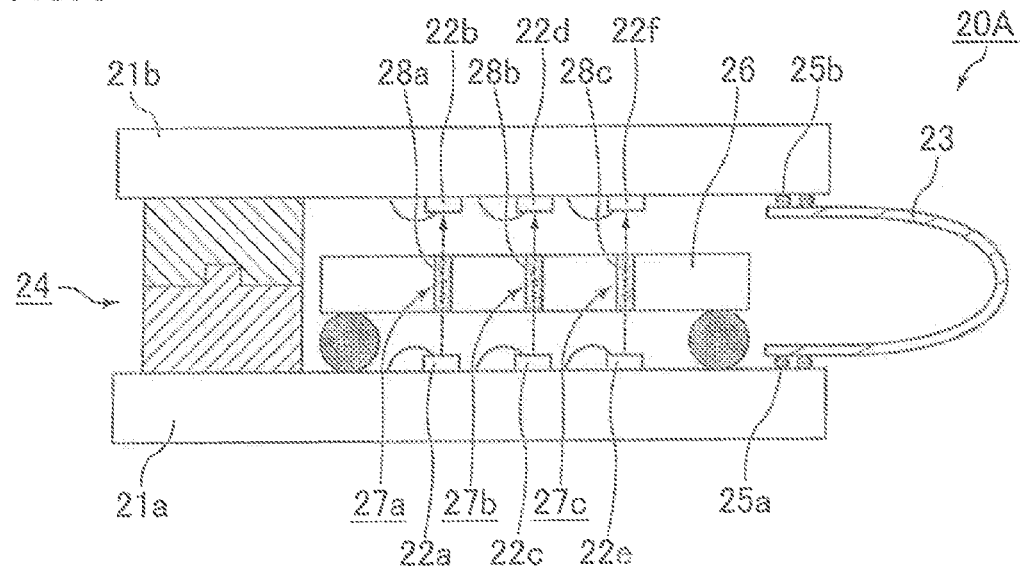
FIG. 9 is a cross-sectional view schematically showing an example of the optical interconnect according to the second embodiment of the present invention.

FIG. 9 is a cross-sectional view schematically showing an example of the optical interconnect according to the second embodiment of the present invention. Optical interconnect (20A) shown in FIG. 9 has first printed wiring board (21*a*), second printed wiring board (21*b*), light-emitting elements (22*a*, 22*c*, 22*e*), light-receiving elements (22*b*, 22*d*, 22*f*), flexible wiring board 23 and connector 24. The above structure is the same as in optical interconnect (10A) shown in FIG. 2 except that light-emitting elements (22*a*, 22*c*, 22*e*) and light-receiving elements (22*b*, 22*d*, 22*f*) are each a wire-bonding optical element, and that the number of optical elements is different. Here, in the optical interconnect of the present embodiment, light-emitting elements and light-receiving elements may each be a flip-chip optical element as well. In addition, although optical interconnect (20A) shown in FIG. 9 shows an example of a 3-channel light-emitting element and light-receiving element, the light-emitting element and the light-receiving element may be other than a 3-channel type or a single-channel type in an optical interconnect of the present embodiment.

Optical interconnect (20A) shown in FIG. 9 further contains interposer 26 positioned between first printed wiring board (21a) and second printed wiring board (21b).

For the interposer in an optical interconnect of the present embodiment, a rigid wiring board is used, the same as that for the first printed wiring board or the second printed wiring board. As shown in FIG. 9, the interposer may be mounted on first printed wiring board (21a) or on second printed wiring board (21b).

In an optical interconnect of the present embodiment, an optical path is formed by forming a penetrating hole in the interposer. In optical interconnect (20A) shown in FIG. 9, multiple independent penetrating holes (27a, 27b, 27c) are separately formed so that optical signals transmitted from the light-emitting elements are received by the light-receiving elements. As described, in an optical interconnect of the present embodiment, an optical signal transmitted from a light-emitting element is guided to a light-receiving element through an optical path formed in the interposer.

When penetrating holes are separately formed, the shape of the penetrating holes is as follows, for example: circular cylinder, rectangular rod, elliptic cylinder, truncated cone, column with a bottom surrounded with a straight line and arc, and so forth. The penetrating holes may have the same shape or different shapes.

If penetrating holes are separately formed, the diameter of the cross section of each penetrating hole is preferred to be set in an approximate range of 50 μm~0.2 mm, more preferably, in an approximate range of 50 μm~0.1 mm, the range in which its diameter is smaller than the diameter of the light received in the light-receiving elements and in which optical coupling loss with the light-emitting elements is small. Here, the diameter of the cross section of a penetrating hole is as follows, for example: if a penetrating hole is a circular cylinder, the diameter of its cross section; if it is an elliptic cylinder, the major axis of its cross section; if it is a rectangular rod or polygonal rod, the length of the longest portion of its cross section; and if it is a truncated cone, the diameter of the larger circle. Also, the cross section of a penetrating hole indicates a cross section parallel to the main surfaces of the first printed wiring board.

A penetrating hole is formed so as to suppress light beams from diffusing and to efficiently guide light to a light-receiving element. The conditions for preventing light beams from diffusing inside a penetrating hole are the same as those for a regular optical waveguide: a penetrating hole is filled with material having a higher refraction index than the material for forming an interposer; or the side wall of a penetrating hole is formed with metal. In optical interconnect (20A) shown in FIG. 9, penetrating holes (27a, 27b, 27c) forming optical paths are filled with resin compositions (28a, 28b, 28c) respectively.

The resin ingredients of resin compositions are not limited specifically as long as their absorption rates are low in the communication wavelength band. Specifically, thermosetting resin, thermoplastic resin, photosensitive resin or thermosetting resin part of which is photosensitive and the like are listed. More specifically, the following are listed: epoxy resin; UV-curing epoxy resin; polyolefin resin; acrylic resins such as PMMA (poly(methyl methacrylate)), deuterated PMMA and fluorinated PMMA; polyimide resins such as fluorinated polyimide; silicone resins such as deuterated silicone resin; polymers such as those made from benzocyclobutene; and the like.

Also, other than the above resin ingredients, resin compositions may contain particles such as resin particles, inorganic particles or metallic particles. If resin compositions contain such particles, thermal expansion coefficients are matched between the optical path and the interposer.

As for resin particles contained in resin compositions, for example, particles of the following are listed: thermosetting resin; thermoplastic resin; photosensitive resin; thermosetting resin part of which is photosensitive; composite resin material of thermosetting resin and thermoplastic resin; composite resin material of photosensitive resin and thermoplastic resin; and the like. Specifically, for example, particles of the following are listed: thermosetting resins such as epoxy resin, silicone resin, phenol resin, polyimide resin, bismaleimide resin, polyphenylene resin, polyolefin resin and fluororesin; the above thermosetting resins to which an acrylic group is attached through the reaction of their respective thermosetting groups (such as the epoxy group of epoxy resin) with methacrylic acid or acrylic acid; thermoplastic resins such as phenoxy resin, polyethersulfone (PES), polysulfone (PSF), polyphenylene sulfone (PPS), polyphenylene sulfide (PPES), polyphenyl ether (PPE) and polyetherimide (PI); and photosensitive resins such as acrylic resin. Also, as for resin particles contained in resin compositions, particles of the following may also be used: composite resin materials of the above thermosetting resins and thermoplastic resins; and composite resin materials of the above resins with acrylic group or the above photosensitive resins and thermoplastic resins. Alternatively, resin particles made of rubber may also be used for the resin particles.

As inorganic particles contained in resin compositions, for example, particles of the following are used: aluminum compounds such as alumina and aluminum hydroxide; calcium compounds such as calcium carbonate and calcium hydroxide; potassium compounds such as potassium carbonate; magnesium compounds such as magnesium oxide, dolomite and basic magnesium carbonate; silicone compounds such as silica and zeolite; titanium compounds such as titania. Particles made by mixing silica and titania at a certain ratio and fusing them for uniform consistency may also be used. Alternatively, particles of phosphorus or phosphine compounds may be used as inorganic particles contained in resin compositions.

As for metallic particles contained in resin compositions, for example, particles of the following are used: gold, silver, copper, palladium, nickel, platinum, iron, zinc, lead, aluminum, magnesium, calcium and so forth. Those resin particles, inorganic particles and metallic particles may be used alone or by combining two or more kinds.

The shape of particles (resin particles, inorganic particles or metallic particles) contained in resin compositions is not limited specifically. For example, shapes such as spherical, ellipsoidal, fragmental and polyhedral are listed. Among those, spherical or ellipsoidal particles are preferred. Since spherical and ellipsoidal particles do not have angles, cracking or the like seldom occurs in a resin composition filled in a penetrating hole.

In addition, the particle diameter (the length of the longest portion of a particle) of particles (resin particles, inorganic particles or metallic particles) contained in resin compositions is preferred to be shorter than the communication wavelength. If the particle diameter is longer than the communication wavelength, optical signals are scattered and prevented from being transmitted.

Also, among the particles (resin particles, inorganic particles or metallic particles) contained in resin compositions, the average particle diameter is preferably a minimum of 0.01 more preferably 0.1 μm and even more preferably 0.2 μm. On the other hand, the average diameter of the above particles is preferably a maximum of 0.8 µm, more preferably 0.6 µm. If the particle diameter is in the above range, particles with two or more different particle diameters may be contained. In the present application, the particle diameter indicates the length of the longest portion of a particle.

The amount of particles contained in a resin composition is preferably a minimum of 10 wt. %, more preferably 20 wt. %. On the other hand, the amount of particles contained in a resin composition is preferably a maximum of 50 wt. %, more preferably 40 wt. %. If the amount of contained particles is less than 10 wt. %, effects from the contained particles are not achieved. On the other hand, if the amount of contained particles exceeds 50 wt. %, such a resin composition is difficult to fill in a penetrating hole.

As described above, in an optical interconnect of the present embodiment, the side wall of a penetrating hole may be formed with a metal instead of a penetrating hole being filled with a resin composition. When forming the side wall of a penetrating hole with a metal, for example, a method such as forming a metal layer by copper plating or the like on the side wall of a penetrating hole is used. When a metal layer is formed on the side wall of a penetrating hole, such a penetrating hole may be hollow or filled with the above resin composition.

When the side wall of a penetrating hole is formed with a metal, materials such as copper, nickel, chrome, titanium and noble metals are used, for example. Also, when a metal layer is formed on the side wall of a penetrating hole, the metal layer may be a single layer or two or more layers. In addition, the metal layer may function as a through hole (via hole); namely, it may function to electrically connect conductive circuits sandwiching a substrate, or conductive circuits sandwiching a substrate and an interlayer resin insulation layer.

Also, the metal layer may be formed with a lustrous metal. If the material for the metal layer is a lustrous metal, when an optical signal is reflected on the side wall of a penetrating hole, the signal intensity is seldom reduced. As for lustrous metals, for example, gold, silver, nickel, platinum, aluminum, rhodium and the like are used. In addition, copper and palladium, for example, may also be used as lustrous metals. However, those materials tend to be oxidized, resulting in oxidized film which causes a decrease in the degree of luster on the metal layer surface. Accordingly, the oxidized film is required to be removed to increase the degree of luster on the metal layer surface. Lustrous metals are not limited to the above, and other metals may be used as long as they have specular gloss or clear luster.

In an optical interconnect of the present embodiment, if a light-emitting element and a light-receiving element are single channel, the distance between the light-emitting element and the interposer is preferred to be approximately 0.4 mm or less so that the coupling loss is 6 dB or smaller. Also, the distance between the light-receiving element and the interposer is preferred to be approximately 0.6 mm or less so that the coupling loss is 6 dB or smaller.

Alternatively, in an optical interposer of the present embodiment, if the light-emitting element and the light-receiving element are multichannel, to set the crosstalk at −20 dB or less, the distance between the light-receiving element and the interposer is preferred to be approximately 0.5 mm or less.

In an optical interconnect of the present embodiment, the positioning section is not always required. However, a positioning section such as a connector is preferred to be formed in an optical interconnect. If a positioning section is formed in an optical interconnect, the alignment accuracy increases between a light-emitting element and a light-receiving element. If a positioning section is not formed in an optical interconnect of the present embodiment, a spacer is preferred to be inserted between the first printed wiring board and the second printed wiring board.

In an optical interconnect of the present embodiment, the electrical-connection section is not limited to conductive material with a flexible wiring board, and it may also be an electrical-connection section structured the same as those in the optical interconnects shown in FIG. 4(a), FIG. 4(b) and FIG. 4(c).

Next, the method for manufacturing an optical interconnect of the present embodiment is described. Here, an example of the method is described for manufacturing optical interconnect (20A) shown in FIG. 9. The method for manufacturing an optical interconnect of the present embodiment is the same as the method for manufacturing an optical interconnect according to the first embodiment of the present invention, except for a step of forming an interposer and a step of mounting the interposer on the first printed wiring board. The order of the manufacturing steps is not limited specifically. Therefore, only a step of forming an interposer and a step of mounting the interposer on the first printed wiring board are described in the following.

First, penetrating holes are formed in a rigid wiring board the same as that for the first printed wiring board. For example, penetrating holes are formed by drilling, router processing, laser processing, die processing or the like. As a laser to be used for laser processing, for example, a carbon dioxide laser, a UV laser, an excimer laser and the like are listed. Among those, an excimer laser or a carbon dioxide laser with short pulse is preferred. Positions for the penetrating holes are not limited specifically, and they are selected properly in consideration of the positions for mounting optical elements. The penetrating holes are preferred to be formed separately for each optical element (light-emitting element or light-receiving element). Alternatively, they may be formed separately for each signal wavelength.

Next, a resin composition is filled in the penetrating holes formed in the rigid wiring board. In particular, an uncured resin composition is filled in the penetrating holes and then cured. The method for filling an uncured resin composition in the penetrating holes is not limited specifically. For example, methods such as printing and potting are employed. When an uncured resin composition is filled in the penetrating holes by printing, the uncured resin composition may be printed once, or the printing procedure may be divided into two or more.

In addition, when filling an uncured resin composition in the penetrating holes, an amount slightly greater than the inner volume of the penetrating holes is filled and then the excess resin composition spilled from the penetrating holes may be removed after the filling is completed. Such excess resin composition is removed, for example, by polishing or the like. Also, when excess resin composition is removed, the resin composition may be either semicured or completely cured, and the timing for removal is appropriately selected considering the material of the resin composition or the like. Through the above steps, an interposer is formed, having optical paths formed by filling the resin composition in the penetrating holes.

Next, the interposer is mounted at a predetermined spot on the first printed wiring board. Then, an optical interconnect of the present embodiment is manufactured through the same process as that for an optical interconnect according to the first embodiment of the present invention.

Also, when manufacturing an optical interconnect where the side wall of a penetrating hole is formed with a metal, a penetrating hole is formed and then the metal layer is formed on the side wall of the penetrating hole. As the method for forming a metal layer, for example, electroless plating, sputtering, vacuum deposition and the like are used. Specifically, for example, the following method is employed: after a penetrating hole is formed, catalytic nuclei are attached to the side wall of the penetrating hole, and then the rigid wiring board with the formed penetrating hole is immersed in an electroless plating bath. Alternatively, a metal layer may be formed with two or more layers by combining electroless plating and sputtering. Yet alternatively, a metal layer may be formed with two or more layers by performing electrolytic plating after electroless plating or sputtering. In addition, when a metal layer is formed on the side wall of a penetrating hole, the metal layer may be lustrous.

According to the present embodiment, the following effect is achieved along with effects (1)~(3) described in the first embodiment of the present invention.

(4) An optical interconnect of the present embodiment further contains an interposer positioned between the first printed wiring board and the second printed wiring board. In the interposer, an optical path is formed to guide an optical signal transmitted from a light-emitting element to a light-receiving element, and a penetrating hole is formed in the optical path. If an interposer is inserted between printed wiring boards and an optical path is formed in the interposer, even if the distance is great between the light-emitting element and the light-receiving element, or even if multichannel signals are transmitted, problems such as optical signal loss between the light-emitting element and the light-receiving element and crosstalk between the adjacent channels are prevented from occurring.

Third Embodiment

An optical interconnect according to the third embodiment of the present invention further contains a sub-mounting board electrically connected to a printed wiring board, and an optical element is positioned on the sub-mounting board. The rest is the same as the structure of an optical interconnect according to the first embodiment of the present invention. Therefore, descriptions redundant with those for an optical interconnect according to the first embodiment of the present invention are omitted here.

In the present application, if it is not required to distinguish between a first sub-mounting board and a second sub-mounting board, they are referred to simply as sub-mounting boards.

Figure 10:
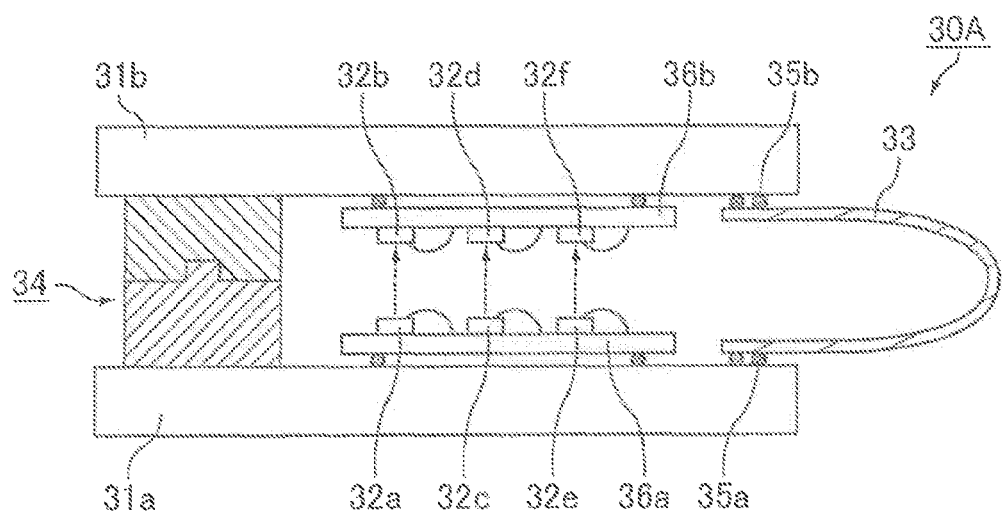
FIG. 10 is a cross-sectional view schematically showing an example of the optical interconnect according to the third embodiment of the present invention.

FIG. 10 is a cross-sectional view schematically showing an example of the optical interconnect according to the third embodiment of the present invention. Optical interconnect (30A) shown in FIG. 10 has first printed wiring board (31a), second printed wiring board (31b), light-emitting elements (32a, 32c, 32e), light-receiving elements (32b, 32d, 32f), flexible wiring board 33 and connector 34.

Optical interconnect (30A) shown in FIG. 10 further contains first sub-mounting board (36a) and second sub-mounting board (36b). First sub-mounting board (36a) is mounted on first printed wiring board (31a) and electrically connected to first printed wiring board (31a). Also, second sub-mounting board (36b) is mounted on second printed wiring board (31b) and electrically connected to second printed wiring board (31b).

Light-emitting elements (32a, 32c, 32e) are mounted on first sub-mounting board (36a). Thus, light-emitting elements (32a, 32c, 32e) are electrically connected to first printed wiring board (31a) through first sub-mounting board (36a). Light-receiving elements (32b, 32d, 32f) are mounted on second sub-mounting board (36b). Thus, light-receiving elements (32b, 32d, 32o) are electrically connected to second printed wiring board (31b) through second sub-mounting board (36b).

Rigid wiring boards having the same structure as the first printed wiring board or the second printed wiring board, and smaller than the printed wiring boards are used for the first and second sub-mounting boards respectively. Alternatively, flexible wiring boards may be used for the first and second sub-mounting boards.

Light-receiving elements (32b, 32d, 32f) are also structured to be capable of directly receiving optical signals transmitted from light-emitting elements (32a, 32c, 32e) respectively in optical interconnect (30A) shown in FIG. 10. Optical interconnect (30A) shown in FIG. 10 shows an example in which light-emitting elements (32a, 32c, 32e) and light-receiving elements (32b, 32d, 32f) are each a wire-bonding optical element. However, light-emitting elements and light-receiving elements in an optical interconnect of the present embodiment may each be a flip-chip bonding optical element as well.

In an optical interconnect of the present embodiment, the distance between a light-emitting element and a light-receiving element is preferred to be approximately 0.2 mm or greater. In addition, the distance between the light-emitting element and the light-receiving element is preferred to be approximately 5 mm or less, more preferably approximately 2 mm or less.

In an optical interconnect of the present invention, the thickness of a sub-mounting board is set so that the distance between a light-emitting element and a light-receiving element is in an approximate range of 0.2~5 mm. Also, the thickness of a sub-mounting board is usually required to be at least 0.3 mm or greater so that the board does not warp. In addition, the distance between the first sub-mounting board and the second sub-mounting board is preferred to be in an approximate range of 0.6~5.4 mm, the sum of the mounting height of the light-emitting element and the light-receiving element, which is approximately 0.4 mm, and the distance between the light-emitting element and the light-receiving element, which is approximately 0.2~5 mm.

In an optical interconnect of the present embodiment, a positioning section is not always required, either. However, an optical interconnect is preferred to contain a positioning section such as a connector. If an optical interconnect has a positioning section, the alignment accuracy increases between the light-emitting element and the light-receiving element. In addition, if a positioning section is not formed in an optical interconnect of the present embodiment, a spacer is preferred to be inserted between the first and second printed wiring boards.

The rest of the structure is the same as that of optical interconnect (10A) shown in FIG. 2.

The electrical-connection section in an optical interconnect of the present embodiment is not limited to conductive material with a flexible wiring board. The electrical-connection section may be structured the same as those in optical interconnects shown in FIG. 4(a), FIG. 4(b) and FIG. 4(c).

FIG. 11(a) and FIG. 11(b) are cross-sectional views schematically showing other examples of the optical interconnect according to the third embodiment of the present invention. As shown in FIG. 11(a), optical interconnect (30B) may have only first sub-mounting board (36a) as its sub-mounting board. Alternatively, as shown in FIG. 11(b), optical interconnect (30C) may have only second sub-mounting board (36b) as its sub-mounting board.

Next, the method for manufacturing an optical interconnect of the present embodiment is described. The method for manufacturing an optical interconnect of the present embodiment is the same as the method for manufacturing an optical interconnect according to the first embodiment of the present invention except for the following. The order of the manufacturing steps is not limited specifically. In the method for manufacturing an optical interconnect of the present embodiment, a sub-mounting board with an optical element is mounted on a printed wiring board instead of the optical element being mounted on the printed wiring board.

When manufacturing an optical interconnect of the present embodiment, it is also an option to mount a sub-mounting board on a printed wiring board, and then to mount an optical element on the sub-mounting board.

According to the present embodiment, the following effect is achieved along with effects (1)~(3) described in the first embodiment of the present invention.

(5) An optical interconnect of the present embodiment further contains a sub-mounting board electrically connected to a printed wiring board, and an optical element is positioned on the sub-mounting board. If at least either a light-emitting element or a light-receiving element is mounted on a sub-mounting board, mounting costs are reduced since at least either the light-emitting element or the light-receiving element is mounted on a printed wiring board through the same surface-mounting process as other electronic components.

Fourth Embodiment

In an optical interconnect according to the fourth embodiment of the present invention, at least either the light-emitting element or the light-receiving element is sealed with resin. The rest is the same as the structure of an optical interconnect according to the first embodiment of the present invention. Therefore, descriptions redundant with those for an optical interconnect according to the first embodiment of the present invention are omitted here.

Figure 12:
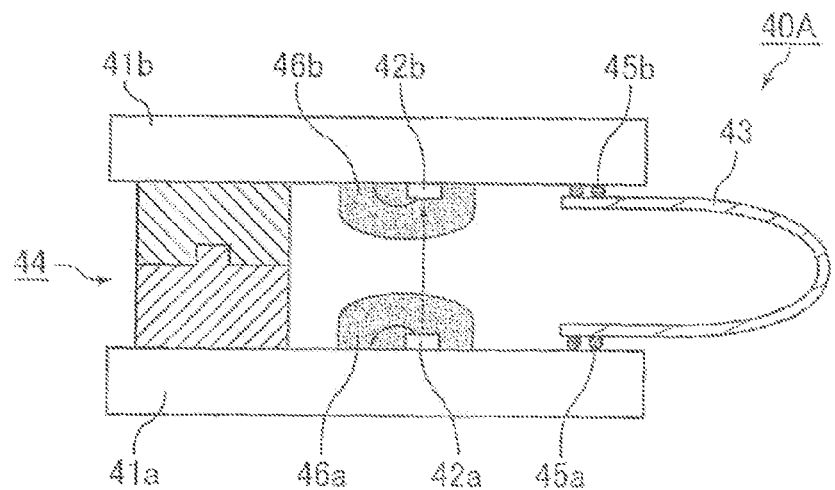
FIG. 12 is a cross-sectional view schematically showing an example of the optical interconnect according to the fourth embodiment of the present invention.

FIG. 12 is a cross-sectional view schematically showing an example of the optical interconnect according to the fourth embodiment of the present invention. Optical interconnect (40A) shown in FIG. 12 has first printed wiring board (41a), second printed wiring board (41b), light-emitting element (42a), light-receiving element (42b), flexible wiring board 43 and connector 44. The above structures are the same as those in optical interconnect (10A) shown in FIG. 2 except that light-emitting element (42a) and light-receiving element (42b) are both wire-bonding optical elements. In an optical interconnect of the present embodiment, the light-emitting element and the light-receiving element may each be a flip-chip bonding optical element as well.

In optical interconnect (40A) shown in FIG. 12, light-emitting element (42a) and light-receiving element (42b) are sealed with resin (46a, 46b) respectively. In an optical interconnect of the present embodiment, resin may be used to seal only an optical element, or to seal the entire section including other components such as wire bonding. Alternatively, if optical elements are flip-chip mounted, the optical elements may be sealed with underfill material. It is an option to seal only the surrounding portion of an optical element, or to cover the optical element entirely with casing. The resin and underfill material for sealing an optical element are thermoplastic resin or thermosetting resin such as epoxy resin, polyimide resin and silicone resin.

In an optical interconnect of the present embodiment, the distance between the light-emitting element and the light-receiving element is preferred to be approximately 0.2 mm or greater. In addition, the distance between the light-emitting element and the light-receiving element is preferred to be approximately 5 mm or less, more preferably approximately 2 mm or less.

In an optical interconnect of the present embodiment, a positioning section is not always required, either. However, an optical interconnect is preferred to contain a positioning section such as a connector. If an optical interconnect has a positioning section, the alignment accuracy increases between the light-emitting element and the light-receiving element. In addition, if a positioning section is not formed in an optical interconnect of the present embodiment, a spacer is preferred to be inserted between the first and second printed wiring boards.

The rest is the same as the structure of optical interconnect (10A) shown in FIG. 2.

In an optical interconnect of the present embodiment, the electrical-connection section is not limited to a conductive material with a flexible wiring board, and the electrical-connection section may be structured the same as those in the optical interconnects shown in FIG. 4(a), FIG. 4(b) and FIG. 4(c).

Figure 13:
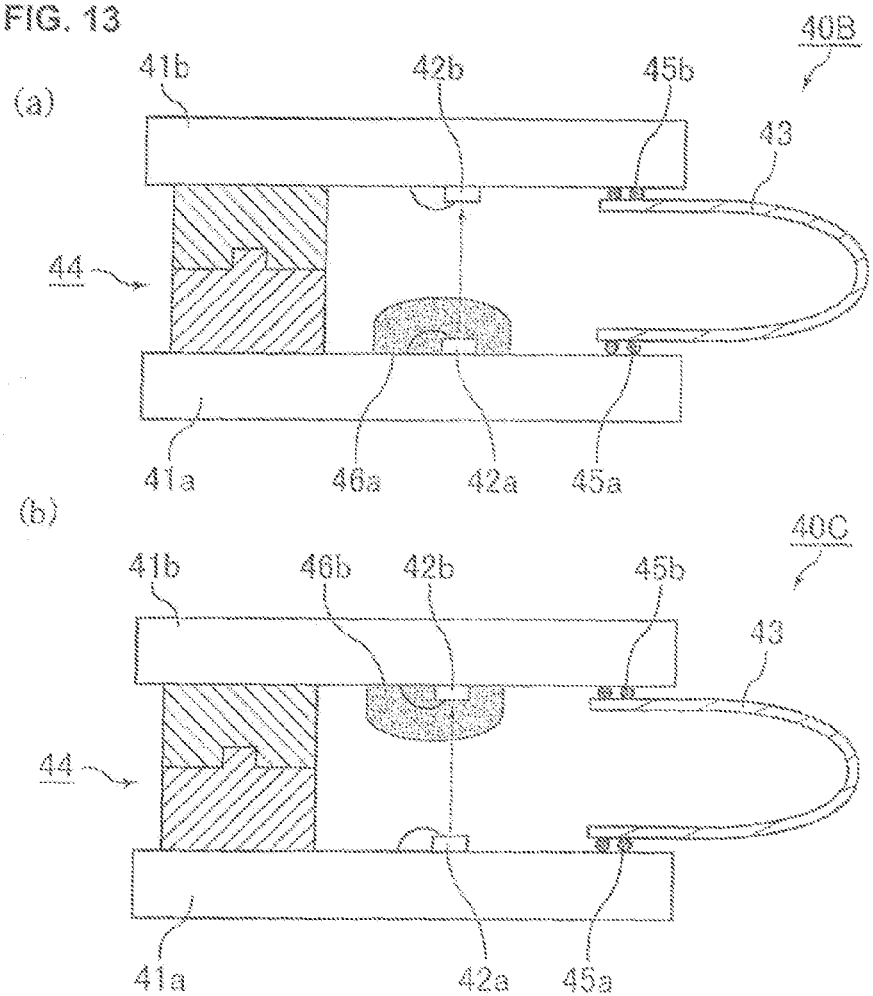
FIG. 13(a) and FIG. 13(b) are cross-sectional views schematically showing other examples of the optical interconnect according to the fourth embodiment of the present invention.

FIG. 13(a) and FIG. 13(b) are cross-sectional views schematically showing other examples of the optical interconnect according to the fourth embodiment of the present invention. In optical interconnect (40B), only light-emitting element (42a) may be sealed with resin (46a) as shown in FIG. 13(a). Alternatively, in optical interconnect (40C), only light-receiving element (42b) may be sealed with resin (46b) as shown in FIG. 13(b).

Next, the method for manufacturing an optical interconnect of the present embodiment is described. Except for the following, the method for manufacturing an optical interconnect of the present embodiment is the same as the method for manufacturing an optical interconnect according to the first embodiment of the present invention. The order of the manufacturing steps is not limited specifically. According to the method for manufacturing an optical interconnect of the present embodiment, an optical element is mounted on a printed wiring board and then the optical element is sealed with resin. As for the method for sealing an optical element with resin, methods such as potting or overmolding resin are used.

According to the present embodiment, the following effects are achieved along with effects (1)~(3) described in the first embodiment of the present invention.

(6) At least either the light-emitting element or the light-receiving element is sealed with resin in an optical interconnect of the present embodiment. Thus, diffusion of beams is reduced in optical signals by the resin covering the surrounding portion of at least the light-emitting element or the light-receiving element. In addition, if the light-emitting element or the light-receiving element is sealed with resin, the light-emitting element or the light-receiving element is prevented from collecting dust or the like.

Fifth Embodiment

In an optical interconnect according to the fifth embodiment of the present invention, the electrical-connection section is formed with either electrical connectors with a flexible wiring board or a conductive material with a flexible wiring board, and the light-emitting element and the light-receiving element are positioned on the flexible wiring board. The rest is the same as the structure of an optical interconnect according to the first embodiment of the present invention. Therefore, descriptions redundant with those for an optical interconnect according to the first embodiment of the present invention are omitted here.

Figure 14:
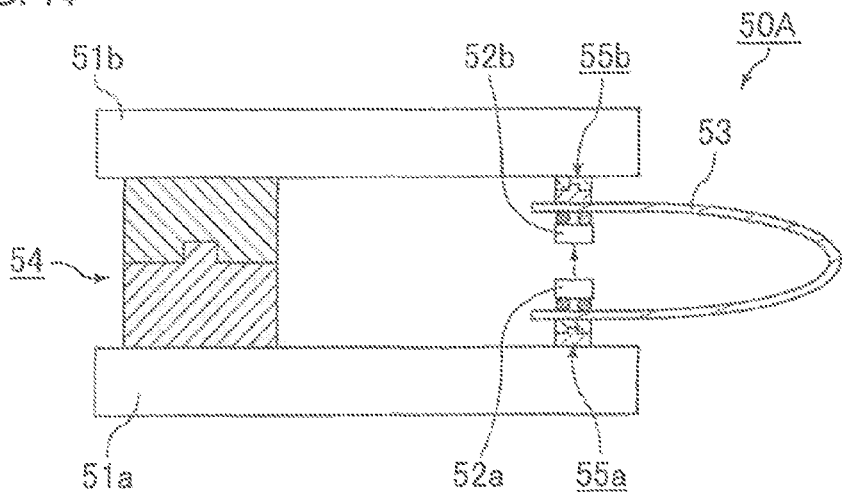
FIG. 14 is a cross-sectional view schematically showing an example of the optical interconnect according to the fifth embodiment of the present invention.

FIG. 14 is a cross-sectional view schematically showing an example of the optical interconnect according to the fifth embodiment of the present invention. Optical interconnect (50A) shown in FIG. 14 has first printed wiring board (51a), second printed wiring board (51b), light-emitting element (52a), light-receiving element (52b), flexible wiring board 53 and connector 54.

In optical interconnect (50A) shown in FIG. 14, light-emitting element (52a) and light-receiving element (52b) are mounted on flexible wiring board 53.

In addition, flexible wiring board 53 is electrically connected to first printed wiring board (51a) and second printed wiring board (51b) through electrical connector (55a) formed on the surface of first printed wiring board (51a) and electrical connector (55b) formed on the surface of second printed wiring board (51b). Namely, in optical interconnect (50A) shown in FIG. 14, electrical connectors (55a, 55b) with flexible wiring board 53 correspond to the electrical-connection section for electrically connecting first printed wiring board (51a) and second printed wiring board (51b).

In optical interconnect (50A) shown in FIG. 14, light-emitting element (52a) is electrically connected to first printed wiring board (51a) through flexible wiring board 53 and electrical connector (55a). Also, light-receiving element (52b) is electrically connected to second printed wiring board (51b) through flexible wiring board 53 and electrical connector (55b).

In an optical interconnect of the present embodiment, it is sufficient if the light-emitting element and the light-receiving element are mounted on the flexible wiring board. Thus, the electrical-connection section is not limited to electrical connectors with a flexible wiring board, and it may be formed with a conductive material along with a flexible wiring board as in optical interconnect (10A) shown in FIG. 2.

In optical interconnect (50A) shown in FIG. 14, light-receiving element (52b) is formed so as to be capable of directly receiving optical signals transmitted from light-emitting element (52a). Optical interconnect (50A) shown in FIG. 14 is an example in which light-emitting element (52a) and light-receiving element (52b) are both flip-chip bonding optical elements. However, in an optical interconnect of the present embodiment, the light-emitting element and the light-receiving element may each be a wire-bonding optical element as well.

In an optical interconnect of the present embodiment, the distance between the light-emitting element and the light-receiving element is preferred to be approximately 0.2 mm or greater. In addition, the distance between the light-emitting element and the light-receiving element is preferred to be approximately 5 mm or less, more preferably approximately 2 mm or less.

In an optical interconnect of the present embodiment, a positioning section is not always required, either. However, a positioning section such as a connector is preferred to be formed in an optical interconnect. If a positioning section is formed in an optical interconnect, the alignment accuracy increases between the light-emitting element and the light-receiving element. If a positioning section is not formed in an optical interconnect of the present embodiment, a spacer is preferred to be inserted between the first printed wiring board and the second printed wiring board.

The rest of the structure is the same as that of optical interconnect (10A) shown in FIG. 2.

Next, the method for manufacturing an optical interconnect of the present embodiment is described. Except for the following, the method for manufacturing an optical interconnect of the present embodiment is the same as the method for manufacturing an optical interconnect according to the first embodiment of the present invention. The order of the manufacturing steps is not limited specifically. According to the method for manufacturing an optical interconnect of the present embodiment, a flexible wiring board with mounted optical elements is mounted on the printed wiring boards instead of optical elements being mounted on the printed wiring boards.

When manufacturing an optical interconnect of the present embodiment, it is also an option to mount optical elements on a flexible wiring board after the flexible wiring board is mounted on printed wiring boards.

According to the present embodiment, the following effect is achieved along with effects (1)~(3) described in the first embodiment of the present invention.

(7) In an optical interconnect of the present embodiment, the electrical-connection section is formed with an electrical connector with a flexible wiring board, or conductive material with a flexible wiring board, and a light-emitting element and a light-receiving element are positioned on the flexible wiring board. Thus, the light-emitting element and the light-receiving element are aligned by the electrical connector or the conductive material connecting the flexible wiring board and the first or second printed wiring board.

Sixth Embodiment

An optical interconnect according to the sixth embodiment of the present invention has an electrical-connection and positioning section structured using an electrical connector, and a light-emitting element and a light-receiving element are built into the electrical connector. The rest is the same as the structure of an optical interconnect according to the first embodiment of the present invention. Therefore, descriptions redundant with those for an optical interconnect according to the first embodiment of the present invention are omitted here.

Figure 15:
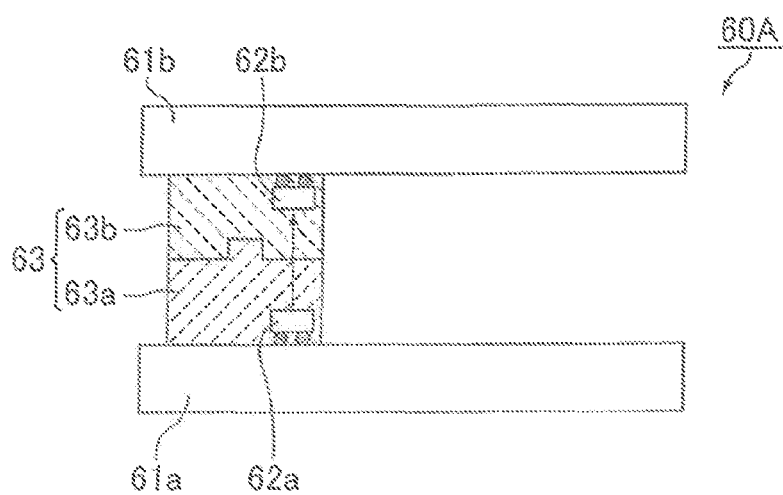
FIG. 15 is a cross-sectional view schematically showing an example of the optical interconnect according to the sixth embodiment of the present invention.

FIG. 15 is a cross-sectional view schematically showing an example of the optical interconnect according to the sixth embodiment of the present invention. Optical interconnect (60A) shown in FIG. 15 has first printed wiring board (61a), second printed wiring board (61b), light-emitting element (62a), light-receiving element (62b) and electrical connector 63.

In optical interconnect (60A) shown in FIG. 15, first printed wiring board (61a) and second printed wiring board (61b) are electrically connected by electrical connector 63. In addition, electrical connector 63 has the function of electrically connecting first printed wiring board (61a) and second printed wiring board (61b), along with the function of setting the relative positions of light-emitting element (62a) and light-receiving element (62b). Namely, in optical interconnect (60A) shown in FIG. 15, electrical connector 63 is the electrical-connection and positioning section.

Electrical connector 63 is formed with first electrical-connector member (63a) positioned on first printed wiring board (61a) and second electrical-connector member (63b) positioned on second printed wiring board (61b). Then, light-emitting element (62a) is built into first electrical-connector member (63a), and light-receiving element (62b) is built into second electrical-connector member (63b).

In optical interconnect (60A) shown in FIG. 15, light-receiving element (62b) is also formed so as to be capable of directly receiving optical signals transmitted from light-emitting element (62a). For example, a hole may be formed in electrical connector 63 or the inside of electrical connector 63 may be transparent so as to enable optical communications between light-emitting element (62a) and light-receiving element (62b).

Optical interconnect (60A) shown in FIG. 15 is an example in which light-emitting element (62a) and light-receiving element (62b) are both flip-chip bonding optical elements. However, the light-emitting element and the light-receiving element in an optical interconnect of the present embodiment may each be a wire-bonding optical element as well.

In an optical interconnect of the present embodiment, the distance between the light-emitting element and the light-receiving element is preferred to be approximately 0.2 mm or greater. In addition, the distance between the light-emitting element and the light-receiving element is preferred to be approximately 5 mm or less, more preferably approximately 2 mm or less.

In an optical interconnect of the present embodiment, the electrical connector electrically connects the first printed wiring board and the second printed wiring board. However, an optical interconnect of the present embodiment may also have a flexible wiring board or another electrical-connection section.

In addition, in an optical interconnect of the present embodiment, the electrical connector sets the relative positions of the light-emitting element and the light-receiving element. However, an optical interconnect of the present embodiment may also have another positioning section or a spacer.

The rest is the same as the structure of optical interconnect (10A) shown in FIG. 2.

Next, the method for manufacturing an optical interconnect of the present embodiment is described. Except for the following, the method for manufacturing an optical interconnect of the present embodiment is the same as the method for manufacturing an optical interconnect according to the first embodiment of the present invention. The order of the manufacturing steps is not limited specifically. According to the method for manufacturing an optical interconnect of the present embodiment, optical elements are built into the electrical connector instead of optical elements being mounted on printed wiring boards. During that time, the light-emitting element and the light-receiving element are aligned automatically.

According to the present embodiment, the following effects are achieved along with effects (1)~(3) described in the first embodiment of the present invention.

(8) In an optical interconnect of the present embodiment, the electrical-connection section has the function of electrically connecting the first printed wiring board and the second printed wiring board along with the function of setting the relative positions of the light-emitting element and the light-receiving element. Accordingly, it is easier for the light-receiving element to directly receive optical signals transmitted from the light-emitting element. Also, the first printed wiring board and the second printed wiring board are fixed steadily by the electrical-connection section having the function of setting the relative positions of the light-emitting element and the light-receiving element.

(9) In an optical interconnect of the present embodiment, the electrical-connection section is formed with an electrical connector, the electrical connector is formed with a first electrical-connector member positioned on the first printed wiring board and a second electrical-connector member positioned on the second printed wiring board, the light-emitting element is built into the first electrical-connector member, and the light-receiving element is built into the second electrical-connector member. In this case, the electrical connector fixes the printed wiring boards at predetermined alignment accuracy. Thus, if the light-emitting element and the light-receiving element are both built into the electrical connector, the light-emitting element and the light-receiving element are aligned accurately. In addition, since the level of alignment accuracy between the light-emitting element and the light-receiving element is easily found prior to fixing the first printed wiring board and the second printed wiring board, the quality inspection of the optical interconnect is carried out easily. Moreover, if the light-emitting element and the light-receiving element are built into the electrical connector, the light-emitting element and the light-receiving element are prevented from collecting dust or the like.

Seventh Embodiment

In addition to an electrical-connection section, an optical interconnect according to the seventh embodiment of the present invention further contains a positioning section formed with a press-fit connector, and a light-emitting element and a light-receiving element are both built into the press-fit connector. The rest is the same as the structure of an optical interconnect according to the first embodiment of the present invention. Therefore, descriptions redundant with those for an optical interconnect according to the first embodiment of the present invention are omitted here.

Figure 16:
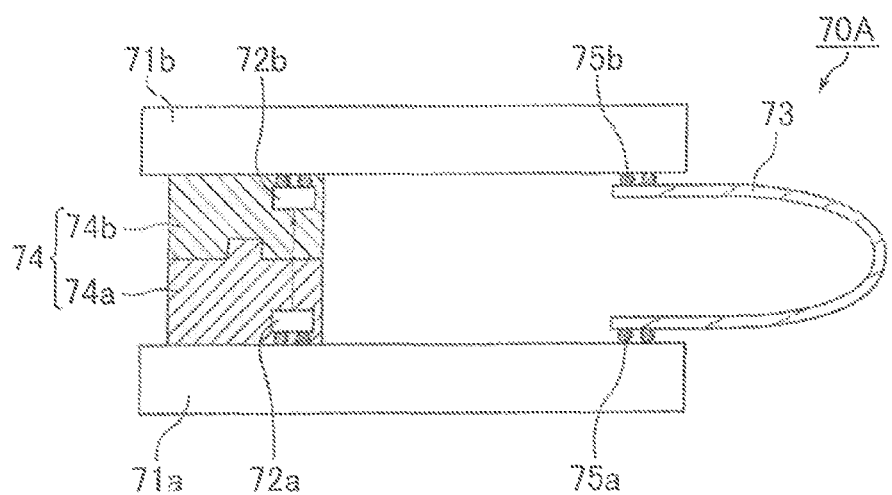
FIG. 16 is a cross-sectional view schematically showing an example of the optical interconnect according to the seventh embodiment of the present invention.

FIG. 16 is a cross-sectional view schematically showing an example of the optical interconnect according to the seventh embodiment of the present invention. Optical interconnect (70A) shown in FIG. 16 has first printed wiring board (71a), second printed wiring board (71b), light-emitting element (72a), light-receiving element (72b), flexible wiring board 73 and press-fit connector 74.

In optical interconnect (70A) shown in FIG. 16, press-fit connector 74 has the function of setting the relative positions of light-emitting element (72a) and light-receiving element (72b). Namely, in optical interconnect (70A) shown in FIG. 16, press-fit connector 74 is the positioning section. As for the press-fit connector, a connector having the structure described in the first embodiment is used.

Press-fit connector 74 is formed with first press-fit connector member (74a) positioned on first printed wiring board (71a) and second press-fit connector member (74b) positioned on second printed wiring board (71b). In addition, light-emitting element (72a) is built into first press-fit connector member (74a) and light-receiving element (72b) is built into second press-fit connector member (74b).

In optical interconnect (70A) shown in FIG. 16, light-receiving element (72b) is also structured so as to be capable of directly receiving optical signals transmitted from light-emitting element (72a). For example, a hole may be formed in press-fit connector 74, or the inside of press-fit connector 74 may be transparent, so as to enable optical communications between light-emitting element (72a) and light-receiving element (72b).

Optical interconnect (70A) shown in FIG. 16 is an example in which light-emitting element (72a) and light-receiving element (72b) are both flip-chip bonding optical elements. However, the light-emitting element and the light-receiving element in an optical interconnect of the present embodiment may each be a wire-bonding optical element as well.

In an optical interconnect of the present embodiment, the distance between the light-emitting element and the light-receiving element is preferred to be approximately 0.2 mm or greater. In addition, the distance between the light-emitting element and the light-receiving element is preferred to be approximately 5 mm or less, more preferably approximately 2 mm or less.

As described above, the press-fit connector sets the relative positions of the light-emitting element and the light-receiving element in an optical interconnect of the present embodiment. However, an optical interconnect of the present embodiment may also have another positioning section or a spacer.

The electrical-connection section in an optical interconnect of the present embodiment is not limited to a conductive material with a flexible wiring board. The electrical-connection section may be structured the same as those in optical interconnects shown in FIG. 4(a), FIG. 4(b) and FIG. 4(c).

The rest is the same as the structure of optical interconnect (10A) shown in FIG. 2.

Next, the method for manufacturing an optical interconnect of the present embodiment is described. Except for the following, the method for manufacturing an optical interconnect of the present embodiment is the same as the method for manufacturing an optical interconnect according to the first embodiment of the present invention. The order of the manufacturing steps is not limited specifically. In the method for manufacturing an optical interconnect of the present embodiment, optical elements are built into a press-fit connector instead of optical elements being mounted on printed wiring boards. During that time, the light-emitting element and the light-receiving element are aligned automatically.

According to the present embodiment, the following effects are achieved along with effects (1)~(3) described in the first embodiment of the present invention.

(10) In addition to the electrical-connection section, an optical interconnect of the present embodiment further contains a positioning section having the function of setting the relative positions of the light-emitting element and the light-receiving element. The light-emitting element and the light-receiving element are aligned by the positioning section. Thus, it is easier for the light-receiving element to directly receive optical signals transmitted from the light-emitting element. Also, the first printed wiring board and the second printed wiring board are fixed steadily by the positioning section.

(11) In an optical interconnect of the present embodiment, the positioning section is formed with a press-fit connector, the press-fit connector is formed with a first press-fit connector member positioned on the first printed wiring board and a second press-fit connector member positioned on the second printed wiring board, the light-emitting element is built into the first press-fit connector member, and the light-receiving element is built into the second press-fit connector member. In this case, the press-fit connector fixes the printed wiring boards at predetermined alignment accuracy. Thus, if the light-emitting element and the light-receiving element are both built into the press-fit connector, the light-emitting element and the light-receiving element are aligned accurately. In addition, since the level of alignment accuracy between the light-emitting element and the light-receiving element is easily found prior to fixing the first printed wiring board and the second printed wiring board, the quality inspection of the optical interconnect is carried out easily. Moreover, if the light-emitting element and the light-receiving element are built into the press-fit connector, the light-emitting element and the light-receiving element are prevented from collecting dust or the like.

Eighth Embodiment

An optical interconnect according to the eighth embodiment of the present invention further contains a control circuit having the function of switching transmission routes so that high-speed data signals are transmitted optically and low-speed data signals are transmitted electrically.

Optical interconnects of the present embodiment are considered to be those described in the first through seventh embodiments of the present invention each containing the above control circuit having a switching function. In the following, an example is described in which an optical interconnect according to the first embodiment of the present invention has a control circuit having a switching function.

Figure 17:
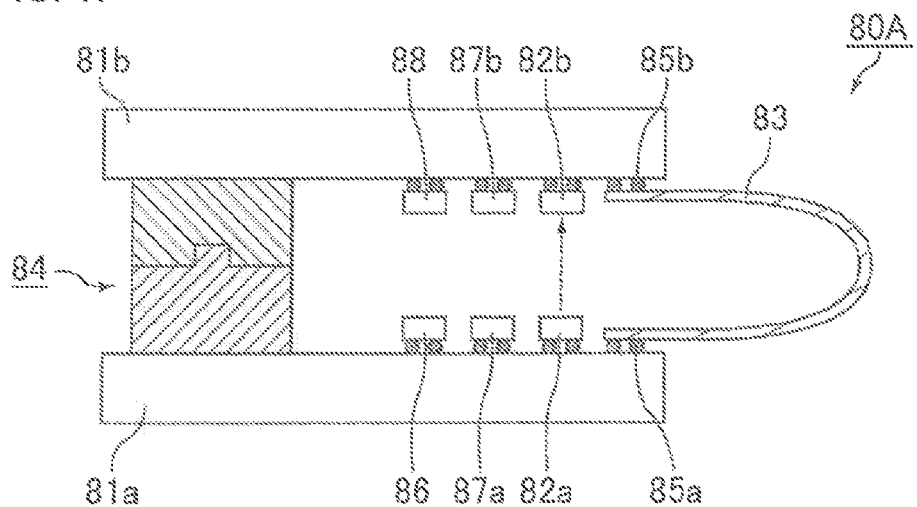
FIG. 17 is a cross-sectional view schematically showing an example of the optical interconnect according to the eighth embodiment of the present invention.

FIG. 17 is a cross-sectional view schematically showing an example of the optical interconnect according to the eighth embodiment of the present invention. Optical interconnect (80A) shown in FIG. 17 has first printed wiring board (81a), second printed wiring board (81b), light-emitting element (82a), light-receiving element (82b), flexible wiring board 83 and connector 84. Such a structure is the same as that of optical interconnect (10A) shown in FIG. 2.

Components such as control circuit 86 having a switching function, drive circuit (driver) (87a) and light-emitting element (82a) are mounted on first printed wiring board (81a). Components such as light-receiving element (82b), control circuit (amplifier) (87b) and switch 88 are mounted on second printed wiring board (81b).

Control circuit 86 having a switching function determines the route (optical route or electrical route) to be used when transmitting data signals from first printed wiring board (81a) to second printed wiring board (81b).

Figure 18:
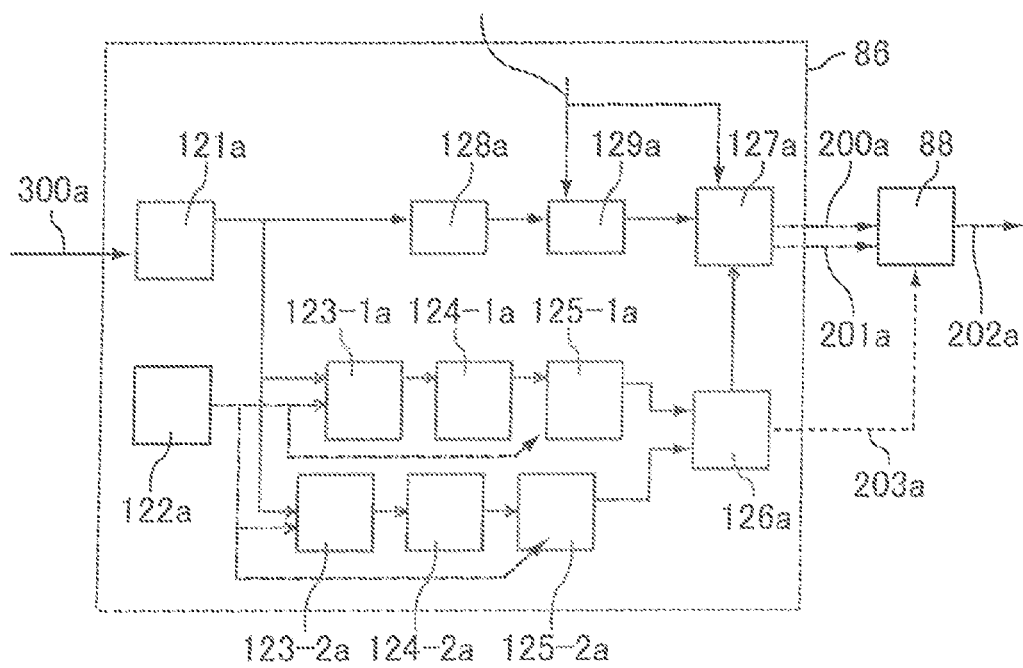
FIG. 18 is a schematic diagram showing an example of the control circuit having a switching function according to an embodiment of the present invention.

FIG. 18 is a schematic diagram showing an example of the control circuit having a switching function according to the present embodiment. As shown in FIG. 18, the control circuit having a switching function is formed with level converter (121a), cycle determiner (122a), first counter (123-1a), second counter (123-2a), first comparator (124-1a), second comparator (124-2a), first retainer circuit (125-1a), second retainer circuit (125-2a), accumulator (126a), selector (127a), delay line (128a) and buffer (129a).

The function of each component is described with reference to FIGS. 18 and 19. FIG. 19(a) and FIG. 19(b) are diagrams to illustrate information on two cycles of a data signal which is counted after it has been input to a control circuit with a switching function.

Level converter (121a) converts a data signal so that a data signal input to control circuit 86 having a switching function is processed at control circuit 86. The Vcc and ground of input data (300a) before being processed at control circuit 86 are occasionally not constant depending on data or the like. Level converter (121a) converts Vcc and ground of input data (300a) to predetermined Vcc (constant) and ground (constant).

For example, input data having 3.3V at Vcc and 0.8V at ground are converted by the level converter to a data signal having 2.2V at Vcc and 0.2V at ground. Also, input data having 1.8V at Vcc and 1.2V at ground are converted by the level converter to a data signal having 2.2V at Vcc and 0.2V at ground. Data signals having voltages other than those are also converted by the level converter to a data signal having 2.2V at Vcc and 0.2V at ground. Those predetermined voltages such as 2.2V at Vcc and 0.2V at ground are simply examples.

As described above, level converter (121a) is for converting input data (300a) to a data signal to be processed at control circuit 86. Thus, if input data (300a) already have voltage levels which can be processed at control circuit 86, level converter (121a) is not required.

The data signal converted by level converter (121a) is transmitted to selector (127a) through delay line (128a) and buffer (129*a*). The data signal is retained at buffer (129*a*) and then is output cycle by cycle to the selector according to the signal (clock signal) input from cycle determiner (122*a*).

The data signal processed by level converter (121*a*) is transmitted to selector (127*a*), while being transmitted to first counter (123-1*a*) and second counter (123-2*a*) to obtain information as to whether the data signal is a high-speed data signal or a low-speed data signal.

When the data signal reaches first counter (123-1*a*) and second counter (123-2*a*), the number of times switching from ground to Vcc is counted. To determine if the transmitted data signal is a high-speed data signal or a low-speed data signal, time along with the number information is used. Thus, as shown in FIG. 19(*a*), the information on cycle (T) is input from cycle determiner (122*a*) to first counter (123-1*a*) and second counter (123-2*a*).

Based on cycle (T), first counter (123-1*a*) and second counter (123-2*a*) count the number of times switching from ground to Vcc (switching number) within a predetermined duration (it is also an option to count the number of times switching from Vcc to ground). For example, first counter (123-1*a*) counts the number when the data signal received from cycle determiner (122*a*) is high level (Vcc); and second counter (123-2*a*) counts the number when the data signal received from cycle determiner (122*a*) is low level (ground). As shown in FIG. 19(*b*), the same data are continuously transmitted to first counter (123-1*a*) and second counter (123-2*a*).

The switching number of data which are continuously input is counted in sequence at each cycle (T) using first counter (123-1*a*) and second counter (123-2*a*). First counter (123-1*a*) counts the switching number during the first half of cycle (T), and second counter (123-2*a*) counts the switching number during the latter half of cycle (T). In FIG. 19(*b*), waveforms in two cycles are shown as an example (in FIG. 19(*b*), the data on left cycle (T) is referred to as left data, and the data on right cycle (T) is referred to as right data). However, continuous data are actually transmitted to first counter (123-1*a*) and second counter (123-2*a*).

In FIG. 19(*b*), the switching number of left data is six (6) during the first half of cycle (T), and seven (7) during the latter half. The switching number of right data is one (1) during the first half of cycle (T) and zero (0) during the latter half. The left data and right data are continuous, but are one cycle off from each other. It is an option for first counter (123-1*a*) to count the number at low level and for second counter (123-2*a*) to count the number at high level. Cycle (T) may be constant or variable, but variable cycles are preferred.

The information on the number counted at first counter (123-1*a*) during the high level of one cycle (final number information of left data: 6, final number information of right data: 1) is transmitted to first comparator (124-1*a*).

At first comparator (124-1*a*), number information received from first counter (123-1*a*) is compared with the number retained at first comparator (124-1*a*) (such as 5). Then, if the received number information exceeds the number retained at first comparator (124-1*a*), first comparator (124-1*a*) outputs a signal to first retainer circuit (125-1*a*) and accumulator (126*a*) signaling that "the data whose switching number is counted at first counter (123-1*a*) are those of a high-speed data signal." The determined result is retained for one cycle at first retainer circuit (125-1*a*) and accumulator (126*a*).

The same process applies to second counter (123-2*a*), second comparator (124-2*a*), second retainer circuit (125-2*a*) and accumulator (126*a*). Namely, at second counter (123-2*a*), the information of the number to be counted during the low level of one cycle (final number information of left data: 7, final number information of right data: 0) is transmitted to second comparator (124-2*a*).

At second comparator (124-2*a*), number information received from second counter (123-2*a*) is compared with the number retained at second comparator (124-2*a*) (such as 5). Then, if the received number information exceeds the number retained at second comparator (124-2*a*), second comparator (124-2*a*) outputs a signal to second retainer circuit (125-2*a*) and accumulator (126*a*) signaling that "the data whose switching number is counted at the second counter are those of a high-speed data signal." The determined result is retained for one cycle at second retainer circuit (125-2*a*) and accumulator (126*a*).

So far, an example in which a data signal was determined to be high speed has been described. In the following, an example is described in which a data signal is determined to be low speed.

After counting is completed (the first half of cycle (T) is completed at first counter (123-1*a*), and one cycle is completed at second counter (123-2*a*)), first counter (123-1*a*) and second counter (123-2*a*) are reset (the switching number becomes 0). The data signal retained at first retainer circuit (125-1*a*), second retainer circuit (125-2*a*) and accumulator (126*a*) (one (1) when the data signal is high speed, and zero (0) when the data signal is low speed) are reset to zero (0) cycle by cycle. Then, if the switching number counted at first counter (123-1*a*) does not reach the number information retained at first comparator (124-1*a*) during one cycle (first half of cycle (T)), the first determined result to be retained at first retainer circuit (125-1*a*) and accumulator (126*a*) is low-speed data signal (0).

The second result is determined in the same manner. If the switching number counted at second counter (123-2*a*) does not reach the number information retained at second comparator (124-2*a*) during one cycle (latter half of cycle (T)), the second determined result to be retained at second retainer circuit (125-2*a*) and accumulator (126*a*) is low-speed data signal (0).

Based on the determined result (first determined result) which is input to accumulator (126*a*) through first retainer circuit (125-1*a*) and another determined result (second determined result) which is input to accumulator (126*a*) through second retainer circuit (125-2*a*), accumulator (126*a*) generates an accumulated determined result. If either the first determined result or the second determined result is a high-speed data signal (1), then the accumulated determined result is registered as a high-speed data signal.

Buffer (129*a*) outputs a data signal to selector (127*a*) based on a clock signal from cycle determiner (122*a*). Based on the clock signal from cycle determiner (122*a*), selector (127*a*) receives the accumulated determined result generated by accumulator (126*a*). Then, the data signal that reached selector (127*a*) from buffer (129*a*) is optically or electrically transmitted depending on the accumulated determined result.

At that time, the data signal determined by accumulator (126*a*) to be a high-speed data signal is optically transmitted. Namely, the high-speed data signal is transmitted as an optical signal from light-emitting element (82*a*) to light-receiving element (82*b*). By contrast, the data signal determined to be a low-speed data signal is electrically transmitted. Namely, the low-speed data signal is transmitted to flexible wiring board 83 as an electrical signal. When a data signal is electrically transmitted, it is preferred that the driver, light-emitting element, light-receiving element and amplifier be switched off.

Moreover, accumulator (126a) outputs the accumulated determined results to switch 88 (data signal 203a). A data signal transmitted from light-receiving element (82b) to second printed wiring board (81b) through light-receiving element (82b) and amplifier 87 reaches switch 88 (route (200a) in FIG. 18). A data signal transmitted to second printed wiring board (81b) through flexible wiring board 83 also reaches switch 88 (route (201a) in FIG. 18).

Based on data signal (203a) from accumulator (126a) (also referred to as an identification signal), switch 88 identifies which route, route (200a) or route (201a), is used when data signal (203a) is transmitted to switch 88. Then, according to the identified result, switch 88 connects either route (200a) and route (202a) or route (201a) and route (202a), and outputs data to a single route (202a) formed on the second printed wiring board.

In the above description, one cycle was used to determine the speed of a data signal, but a half cycle may also be used. Namely, a circuit may be designed so that buffer (129a) and selector (127a) are driven every half cycle based on a clock signal from cycle determiner (122a). Every half cycle, selector (127a) receives a result determined at accumulator (126a). In such a case, accumulator (126a) does not generate an accumulated determined result by accumulating the first determined result and the second determined result; instead, selector (127a) outputs data every half cycle based on the first determined result and the second determined result respectively.

The above description is provided to describe a method for transmitting from the first printed wiring board to the second printed wiring board. In an optical interconnect of the present embodiment, it is also an option for the control circuit having a switching function to be mounted on the second printed wiring board.

A buffer may be built into a selector in an optical interconnect of the present embodiment.

It is an option for either a buffer or a delay line to be formed in an optical interconnect of the present embodiment. A data signal may be directly transmitted to a selector without going through a buffer and a delay line.

In an optical interconnect of the present embodiment, a logic may be mounted on the first printed wiring board.

In an optical interconnect of the present embodiment, a control circuit having a switching function may be built into a driver.

According to the present embodiment, the following effects are achieved along with effects (1)~(11) described in the first through seventh embodiments of the present invention.

(12) An optical interconnect of the present embodiment further contains a control circuit having the function of switching transmission routes to optically transmit a high-speed data signal and to electrically transmit a low-speed data signal. Since it includes electro-optical conversion and optical-electro conversion, optical transmission consumes greater power than electrical transmission. In addition, in a conventional optical transmission, there is a concern of greater power consumption, since an optical interconnect does not have a switching capability and data are always transmitted optically. By contrast, if an optical interconnect has a control circuit with a switching capability, optical transmission is used only when transmitting a high-speed data signal and electrical transmission is used when transmitting a low-speed data signal. Accordingly, reducing power consumption is achieved.

Other Embodiments

In an optical interconnect according to an embodiment of the present invention, the number of light-emitting elements and light-receiving elements facing each other is not limited specifically.

An optical interconnect according to an embodiment of the present invention may be designed in such a way that data signals may also be optically transmitted from the second printed wiring board to the first printed wiring board. Namely, it is an option that an optical interconnect according to an embodiment of the present invention further contains a light-emitting element positioned on the side of the second printed wiring board while being electrically connected to the second printed wiring board, as well as a light-receiving element positioned on the side of the first printed wiring board while being electrically connected to the first printed wiring board, and that the light-receiving element is positioned to face the light-emitting element and is structured so as to be capable of directly receiving optical signals transmitted from the light-emitting element.

If an optical interconnect according to an embodiment of the present invention further contains a control circuit having the function of switching transmission routes to optically transmit a high-speed data signal and to electrically transmit a low-speed data signal, the method for transmitting a data signal from the second printed wiring board to the first printed wiring board may be carried out only through electrical transmission. Alternatively, a data signal may be transmitted from the second printed wiring board to the first printed wiring board by using a switching element.

Optical interconnects according to the first through seventh embodiments of the present invention may each further contain a driver circuit for a light-emitting element (a driver) and a control circuit for a light-receiving element (a preamplifier and comparator, hereinafter also referred to simply as a preamplifier). In such a case, each optical interconnect may further contain a control circuit having a switching function described in the eighth embodiment of the present invention.

If an optical interconnect contains a driver circuit, the driver circuit works as a main circuit of an electro-optical conversion circuit. In addition to a driver circuit, an optical interconnect may contain multiple components such as a switching circuit, a parallel-serial connection circuit and a MAX/DEMAX circuit. The electro-optical conversion circuit may also be a driver circuit which does not include any other component. If an optical interconnect contains a driver circuit having a preamplifier and a comparator, a control circuit works as a main circuit of an optical-electro conversion circuit. In addition to the control circuit, an optical interconnect may also have multiple components such as a switching circuit and a MAX/DEMAX circuit. The optical-electro conversion circuit may also be a control circuit which does not include any other component.

An electro-optical conversion circuit converts a digital electrical signal to an analog current and provides it for a light-emitting element such as a laser diode. An optical-electro conversion circuit amplifies a weak electrical signal output from a light-receiving element such as a photodiode to a digital signal with a constant pulse. The optical-electro conversion device may be a chip component having the above-described functions. The electro-optical conversion device may also be a chip component having the above-described functions.

In an optical interconnect according to an embodiment of the present invention, it is not always required for optical elements to be mounted on a first printed wiring board, a second printed wiring board or a flexible wiring board. In an optical interconnect according to the second and fourth embodiments of the present invention, an optical element (a light-emitting element or a light-receiving element) may also be mounted on a sub-mounting board described in the third embodiment. In an optical interconnect according to the fifth embodiment of the present invention, a flexible wiring board with a mounted light-emitting element and light-receiving element may also be mounted on a sub-mounting board. In optical interconnects according to the sixth and seventh embodiments of the present invention, a connector (electrical connector or a press-fit connector) into which a light-emitting element and a light-receiving element are built may also be mounted on a sub-mounting board.

In an optical interconnect according to an embodiment of the present invention, the connection between an optical element and a printed wiring board is not limited to flip-chip bonding (connection through solder bumps or gold bumps), and any other surface mounting method such as wire bonding may also be used. Also, if an optical interconnect has a driver circuit and a control circuit, the connection between the driver circuit and a printed wiring board and the connection between the control circuit and a printed wiring board may be flip-chip bonding or wire bonding.

An optical interconnect according to an embodiment of the present invention is used suitably in mobile devices such as cell phones, personal digital assistants (PDA), mobile personal computers, portable music players and portable game devices. For example, the first printed wiring board may be used as a main printed wiring board (the printed wiring board arranged to input characters through the keyboard), and the second printed wiring board may be used as a printed wiring board arranged to display images. Alternatively, the first printed wiring board may be used as a printed wiring board arranged to take photos using a camera, and the second printed wiring board may be used as a main printed wiring board. In such a case, large-capacity data such as photos are transmitted to the second printed wiring board at high speed.

On/off signals (for example, the on/off signal for sleep mode) in a mobile device may be used to switch between optical data signal transmission and electrical data signal transmission.

When printed wiring boards for data transmission face each other, by directly transmitting and receiving an optical signal between a light-emitting element and a light-receiving element without using an optical waveguide, optical signal loss is reduced and thus an optical interconnect with less power consumption is obtained.

Namely, an optical interconnect according to an embodiment of the present invention has the following: a first printed wiring board; a second printed wiring board facing the first printed wiring board and connected to the first printed wiring board electrically and optically; a light-emitting element positioned on the side of the first printed wiring board and electrically connected to the first printed wiring board; a light-receiving element positioned on the side of the second printed wiring board and electrically connected to the second printed wiring board; and an electrical-connection section formed on a surface of the first printed wiring board and on a surface of the second printed wiring board to electrically connect the first printed wiring board and the second printed wiring board. The light-receiving element is positioned to face the light-emitting element, and is structured to be capable of directly receiving an optical signal transmitted from the light-emitting element.

In an optical interconnect according to an embodiment of the present invention, the light-receiving element directly receives an optical signal transmitted from the light-emitting element between printed wiring boards facing each other. Thus, in the optical interconnect, an optical waveguide is not required, unlike a conventional optical interconnect using a flexible signal cable. As a result, optical signal loss, which would occur when an optical signal is transmitted from the light-emitting element to the optical waveguide and the optical signal is transmitted from the optical waveguide to the light-receiving element, does not occur. Thus, optical signal loss is less in the optical interconnect than in a conventional optical interconnect. As described above, even if the output power of an optical signal emitted from the light-emitting element is reduced, the optical signal is sufficiently received by the light-receiving element in the optical interconnect. As a result, drive current for the light-emitting element to emit an optical signal is set low, and thus power consumption decreases.

In an optical interconnect according to an embodiment of the present invention, it is not necessary to consider optical signal loss when an optical signal is transmitted from a light-emitting element to an optical waveguide, and when the optical signal is transmitted from the optical waveguide to a light-receiving element. Thus, alignment accuracy of the relative positions is not required between the light-emitting element and the optical waveguide, nor between the optical waveguide and the light-receiving element. Accordingly, costs are reduced when mounting an optical waveguide, a light-emitting element and a light-receiving element onto a flexible wiring board.

In addition, in an optical interconnect according to an embodiment of the present invention, optical coupling is carried out directly between a light-emitting element and a light-receiving element. Namely, since an optical signal is directly transmitted from the light-emitting element to the light-receiving element, optical signal loss is reduced even when the alignment accuracy is low between the light-emitting element and the light-receiving element.

In addition, since an optical waveguide is not required in an optical interconnect according to an embodiment of the present invention, costs for mounting an optical waveguide onto a flexible wiring board and costs for manufacturing and processing the optical waveguide are eliminated when manufacturing an optical interconnect.

In an optical interconnect according to an embodiment of the present invention, optical signal loss is reduced compared with a conventional optical interconnect, and costs for manufacturing and mounting a waveguide are eliminated. As a result, power consumption is reduced and a cost reduction is achieved.

In an optical interconnect according to an embodiment of the present invention, the above electrical-connection section is preferred to be formed with any one of an electrical connector, a conductive material, an electrical connector with a flexible wiring board or a conductive material with a flexible wiring board. Those materials electrically connect the first printed wiring board and the second printed wiring board.

In an optical interconnect according to an embodiment of the present invention, a light-emitting element is preferred to be positioned on the first printed wiring board and a light-receiving element to be positioned on the second printed wiring board.

It is preferred that an optical interconnect according to an embodiment of the present invention further contain an interposer positioned between the first printed wiring board and the second printed wiring board. In the interposer, an optical path is preferred to be formed to guide an optical signal transmitted from a light-emitting element to a light-receiving element, and a penetrating hole to be formed in the optical path. When the distance is great between the light-emitting element and the light-receiving element, or when multichannel signals are transmitted, if an interposer is inserted between printed wiring boards and an optical path is formed in the interposer, problems such as optical signal loss between the light-emitting element and the light-receiving element and crosstalk between the adjacent channels are prevented from occurring.

In the above situation, to enable light to be propagated through the penetrating hole without being diffused outside the penetrating hole, it is preferred that the penetrating hole formed in the optical path of the interposer be filled with a resin composition having a higher refraction index than the material forming the interposer, or that the side wall of the penetrating hole in the optical path of the interposer be formed with a metal. If the resin composition is filled in the penetrating hole, dust or foreign material is prevented from entering the optical path of the interposer. As a result, optical signal transmissions are prevented from being blocked by such dust or foreign material. In addition, if the resin composition is filled in the penetrating hole, the strength of the interposer is prevented from decreasing.

An optical interconnect according to an embodiment of the present invention may further contain a first sub-mounting board electrically connected to the first printed wiring board, and the light-emitting element may be positioned on the first sub-mounting board. In addition, an optical interconnect according to an embodiment of the present invention may further contain a second sub-mounting board electrically connected to the second printed wiring board, and the light-receiving element may be positioned on the second sub-mounting board. Moreover, an optical interconnect according to an embodiment of the present invention may further contain a first sub-mounting board electrically connected to the first printed wiring board and a second sub-mounting board electrically connected to the second printed wiring board, and the light-emitting element may be positioned on the first sub-mounting board and the light-receiving element may be positioned on the second sub-mounting board.

Optical components such as a light-emitting element and a light-receiving element are mounted by a method different from solder-reflow surface mounting for electronic components. Thus, when mounting an optical component and an electrical component on the same board, there is a concern that the mounting process is complex. By contrast, if an optical component is mounted in advance separately on a sub-mounting board which can be surface-mounted, all the components are surface-mounted and the mounting process is simplified. Therefore, if at least either a light-emitting element or a light-receiving element is mounted on a sub-mounting board, at least either a light-emitting element or a light-receiving element is mounted on a printed wiring board through the same surface-mounting process as that for other electronic components. Accordingly, the mounting cost decreases.

In an optical interconnect according to an embodiment of the present invention, at least either the light-emitting element or the light-receiving element is preferred to be sealed with resin. In such a case, beams of an optical signal are suppressed from being diffused by the resin sealed around at least either the light-emitting element or the light-receiving element. Also, if the light-emitting element or the light-receiving element is sealed with resin, the light-emitting element or the light-receiving element is prevented from collecting dust or the like.

In an optical interconnect according to an embodiment of the present invention, it is preferred that the electrical-connection section be structured with either an electrical connector with a flexible wiring board or a conductive material with a flexible wiring board, and that the light-emitting element and the light-receiving element be positioned on the flexible wiring board. In such a case, by the electrical connector or conductive material connecting the flexible wiring board and the first printed wiring board or the second printed wiring board, the light-emitting element and the light-receiving element are aligned.

In an optical interconnect according to an embodiment of the present invention, the electrical-connection section has the function of electrically connecting the first printed wiring board and the second printed wiring board along with the function of setting the relative positions of the light-emitting element and the light-receiving element. In such a case, it is easier for the light-receiving element to directly receive the optical signal transmitted from the light-emitting element. Also, the first printed wiring board and the second printed wiring board are fixed steadily by the electrical-connection section having the function of setting the relative positions of the light-emitting element and the light-receiving element.

In an optical interconnect according to an embodiment of the present invention, if an electrical-connection section has the function of setting the relative positions of a light-emitting element and a light-receiving element, the electrical-connection section is preferred to be structured with an electrical connector, the electrical connector to be formed with a first electrical-connector member positioned on the first printed wiring board and a second electrical-connector member positioned on the second printed wiring board, the light-emitting element to be built into the first electrical-connector member, and the light-receiving element to be built into the second electrical-connector member.

In such a case, the electrical connector fixes printed wiring boards at predetermined alignment accuracy. Thus, if the light-emitting element and the light-receiving element are each built into the electrical connector, the light-emitting element and the light-receiving element are aligned accurately. In addition, since the alignment accuracy level between the light-emitting element and the light-receiving element is found easily in a stage prior to fixing the first printed wiring board and the second printed wiring board, the quality inspection of an optical interconnect is carried out easily. Moreover, if the light-emitting element and the light-receiving element are built into the electrical connector, the light-emitting element and the light-receiving element are prevented from collecting dust or the like.

In addition to the electrical-connection section, an optical interconnect according to an embodiment of the present invention may further contain a positioning section which has the function of setting the relative positions of the light-emitting element and the light-receiving element. The light-emitting element and the light-receiving element are aligned by the positioning section. Accordingly, it is easier for the light-receiving element to directly receive optical signals transmitted from the light-emitting element. In addition, the first printed wiring board and the second printed wiring board are fixed steadily by the positioning section.

In addition to the electrical-connection section, if an optical interconnect according to an embodiment of the present invention further contains a positioning section having the function of setting the relative positions of the light-emitting element and the light-receiving element, the positioning section is preferred to be structured with a press-fit connector, the press-fit connector to be formed with a first press-fit connector member positioned on the first printed wiring board and a second press-fit connector member positioned on the second printed wiring board, the light-emitting element to be built into the first press-fit connector member, and the light-receiving element to be built into the second press-fit connector member. In such a case, the press-fit connector fixes printed wiring boards at predetermined alignment accuracy. Therefore, if the light-emitting element and the light-receiving element are each built into the press-fit connector, the light-emitting element and the light-receiving element are aligned accurately. In addition, since the alignment accuracy level between the light-emitting element and the light-receiving element is found easily in a stage prior to fixing the first printed wiring board and the second printed wiring board, the quality inspection of an optical interconnect is carried out easily. Moreover, if the light-emitting element and the light-receiving element are built into the press-fit connector, the light-emitting element and the light-receiving element are prevented from collecting dust or the like.

In an optical interconnect according to an embodiment of the present invention, the distance between the light-emitting element and the light-receiving element is preferred to be set in an approximate range of 0.2~5 mm. If the distance between the light-emitting element and the light-receiving element is set in an approximate range of 0.2~5 mm, optical signals are directly transmitted and received between the light-emitting element and the light-receiving element while reducing optical signal loss.

An optical interconnect according to an embodiment of the present invention is preferred to further contain a control circuit having the function of switching transmission routes to optically transmit a high-speed data signal and to electrically transmit a low-speed data signal.

Although using an optical interconnect is an effective method for high-speed data transmission, since data transmission by an optical interconnect involves electro-optical conversion and optical-electro conversion, there are drawbacks such as greater power consumption than using an electrical interconnect. However, since high-speed data transmission such as uploading/downloading animations does not occur frequently in mobile equipment, it is not necessary to transmit the entire data through the optical interconnect. Thus, using the optical interconnect only for high-speed data transmission reduces power consumption. As described, if an optical interconnect contains a control circuit having the above switching function, power consumption is minimized.

Obviously, numerous modifications and variations of the present invention are possible in light of the above teachings. It is therefore to be understood that within the scope of the appended claims, the invention may be practiced otherwise than as specifically described herein.

What is claimed is:

1. An optical interconnect device, comprising:
   a first printed wiring board;
   a second printed wiring board facing the first printed wiring board;
   a light-emitting device positioned on the first printed wiring board and electrically connected to the first printed wiring board;
   a light-receiving device positioned on the second printed wiring board and electrically connected to the second printed wiring board such that the light-receiving device faces the light-emitting device and is configured to receive an optical signal transmitted in a direct line from the light-emitting device;
   an electrical-connection device mounted on the first printed wiring board and the second printed wiring board such that the first printed wiring board is electrically connected to the second printed wiring board; and
   a control circuit configured to switch a high-speed data signal to an optical transmission and a low-speed data signal to an electrical transmission,
   wherein the optical transmission is carried out by the light-emitting device and the light receiving device, and the electrical transmission is carried out by the electrical connection device.

2. The optical interconnect according to claim 1, wherein the electrical-connection device is one of an electrical connector, a conductive material, a flexible wiring board having an electrical connector, and a flexible wiring board having a conductive material.

3. The optical interconnect according to claim 1, wherein the light-emitting device is mounted on a surface of the first printed wiring board, and the light-receiving device is mounted on a surface of the second printed wiring board.

4. The optical interconnect according to claim 1, further comprising an interposer positioned between the first printed wiring board and the second printed wiring board, wherein the interposer has an optical path configured to guide an optical signal transmitted from the light-emitting device to the light-receiving device.

5. The optical interconnect according to claim 4, wherein the interposer has a penetrating hole forming the optical path, and the penetrating hole is filled with a resin composition having a refraction index which is higher than a refractive index of a material forming the interposer.

6. The optical interconnect according to claim 4, wherein the penetrating hole has a side wall comprising a metal.

7. The optical interconnect according to claim 1, further comprising a first sub-mounting board mounted on the first printed wiring board and electrically connected to the first printed wiring board, wherein the light-emitting device is mounted on the first sub-mounting board.

8. The optical interconnect according to claim 1, further comprising a second sub-mounting board mounted on the second printed wiring board and electrically connected to the second printed wiring board, wherein the light-receiving device is mounted on the second sub-mounting board.

9. The optical interconnect according to claim 1, further comprising:
   a first sub-mounting board mounted on the first printed wiring board and electrically connected to the first printed wiring board; and
   a second sub-mounting board mounted on the second printed wiring board and electrically connected to the second printed wiring board,
   wherein the light-emitting device is mounted on the first sub-mounting board, and the light-receiving device is mounted on the second sub-mounting board.

10. The optical interconnect according to claim 1, wherein at least one of the light-emitting device and the light-receiving device is sealed with a resin.

11. The optical interconnect according to claim 2, wherein the electrical-connection device comprises a flexible wiring board having one of an electrical connector and a conductive material, and the light-emitting device and the light-receiving device are mounted on the flexible wiring board.

12. The optical interconnect according to claim 1, wherein the electrical-connection device is configured to set relative positions of the light-emitting device and the light-receiving device.

13. The optical interconnect according to claim 1, further comprising a positioning device configured to set relative positions of the light-emitting device and the light-receiving device.

14. The optical interconnect according to claim 13, wherein the positioning device comprises a press-fit connector, the press-fit connector has a first press-fit connector portion positioned on the first printed wiring board and a second press-fit connector portion positioned on the second printed wiring board, the light-emitting device is built into the first press-fit connector portion, and the light-receiving device is built into the second press-fit connector portion.

15. The optical interconnect according to claim 13, wherein the electrical-connection device comprises a press-fit connector, and the press-fit connector has a first press-fit connector portion positioned on the first printed wiring board and a second press-fit connector portion positioned on the second printed wiring board.

16. The optical interconnect according to claim 1, wherein the light-emitting device and the light-receiving device are positioned such that a distance between the light-emitting device and the light-receiving device is set in an approximate range of 0.2~5 mm.

17. The optical interconnect according to claim 2, further comprising a positioning device configured to set relative positions of the light-emitting device and the light-receiving device.

18. The optical interconnect according to claim 17, wherein the positioning device comprises a press-fit connector, the press-fit connector has a first press-fit connector portion positioned on the first printed wiring board and a second press-fit connector portion positioned on the second printed wiring board, the light-emitting device is built into the first press-fit connector portion, and the light-receiving device is built into the second press-fit connector portion.

19. The optical interconnect according to claim 1, wherein the electrical-connection device comprises a press-fit connector, and the press-fit connector has a first press-fit connector portion positioned on the first printed wiring board and a second press-fit connector portion positioned on the second printed wiring board.

20. The optical interconnect according to claim 1, further comprising a positioning device configured to set relative positions of the light-emitting device and the light-receiving device, wherein the light-emitting device and the light-receiving device are positioned such that a distance between the light-emitting device and the light-receiving device is set in an approximate range of 0.2~5 mm.

* * * * *